(12) United States Patent
Noda

(10) Patent No.: US 11,853,553 B2
(45) Date of Patent: Dec. 26, 2023

(54) MEMORY SYSTEM WITH A MEMORY CONTROLLER PERFORMING READ OPERATIONS USING INDEXED PARAMETERS BASED ON A TIME DIFFERENCE BETWEEN WRITE OPERATIONS

(71) Applicant: KIOXIA CORPORATION, Tokyo (JP)

(72) Inventor: Yuko Noda, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/400,955

(22) Filed: Aug. 12, 2021

(65) Prior Publication Data

US 2022/0300164 A1 Sep. 22, 2022

(30) Foreign Application Priority Data

Mar. 18, 2021 (JP) .................................. 2021-045228

(51) Int. Cl.
| | |
|---|---|
| *G06F 3/06* | (2006.01) |
| *G11C 16/10* | (2006.01) |
| *G11C 16/26* | (2006.01) |
| *G11C 16/08* | (2006.01) |
| *G11C 16/04* | (2006.01) |

(52) U.S. Cl.
CPC .......... *G06F 3/0611* (2013.01); *G06F 3/0659* (2013.01); *G06F 3/0679* (2013.01); *G11C 16/08* (2013.01); *G11C 16/10* (2013.01); *G11C 16/26* (2013.01); *G06F 2201/835* (2013.01); *G11C 16/0483* (2013.01)

(58) Field of Classification Search
CPC ..................................................... G06F 3/0611
See application file for complete search history.

(56) References Cited

U.S. PATENT DOCUMENTS

| | | | |
|---|---|---|---|
| 8,248,856 B2 | 8/2012 | Goss et al. | |
| 8,929,140 B2* | 1/2015 | Nagashima | G11C 16/24 365/185.11 |
| 9,449,695 B2 | 9/2016 | Kim et al. | |
| 2015/0179274 A1* | 6/2015 | Kim | G11C 16/3418 711/216 |
| 2017/0329525 A1* | 11/2017 | Simonson | G06F 12/00 |
| 2019/0286518 A1* | 9/2019 | Asami | G06F 11/1012 |
| 2019/0332323 A1 | 10/2019 | Choi | |
| 2021/0134378 A1* | 5/2021 | Papandreou | G11C 29/028 |

* cited by examiner

*Primary Examiner* — Khoa D Doan
*Assistant Examiner* — Marwan Ayash
(74) *Attorney, Agent, or Firm* — Kim & Stewart LLP

(57) ABSTRACT

A memory system includes a non-volatile memory in which data is stored in a plurality of pages including a first page and a second page and a memory controller. The controller is configured to perform a first write operation on the first page at a first time, perform a second write operation on the second page at a second time after the first time, perform a first read operation on the first page at a time after the first time using a first parameter and store a first index value in association with the first page and the first parameter, and determine a second parameter for a second read operation to be performed on the second page using a time difference between the first time and the second time and the first index value stored in association with the first page.

14 Claims, 23 Drawing Sheets

| Shift table #0 | |
|---|---|
| Index # | Shift value |
| #0 | Read Value Immediately After Write |
| #1 | Read Value After One Day |
| #2 | Read Value After Three Days |
| ... | ... |
| #m | ... |

| Write time table (Blk:#0, Page:Lower) ||
|---|---|
| Address | Write Time |
| WL0 | $t_0$ |
| WL1 | $t_1$ |
| ... | ... |
| WL7 | $t_7$ |
| ... | ... |
| WL N-1 | $t_{N-1}$ |
| WL N | $t_N$ |

| History Group Table (Blk #0) | | |
|---|---|---|
| Group # | Table # | Index # |
| #0 | #0 | #0 |
| #1 | #0 | #1 |
| #2 | #0 | #2 |
| ... | ... | ... |
| #n | #0 | #m |

| Blk # | Page | WL | Index # |
|---|---|---|---|
| #0 | Lower | 0-7 | #0 |
| #0 | Lower | 8-15 | #1 |
| ... | ... | ... | ... |
| #1 | Lower | 0-7 | #1 |
| #1 | Lower | 8-15 | #2 |
| ... | ... | ... | ... |

FIG. 11

| History Information (Blk: #0) | |
|---|---|
| Address | Historical Value |
| WL0 | #0 |
| WL1 | #1 |
| ... | ... |

| History Information (Blk: #1) | |
|---|---|
| Address | Historical Value |
| ... | ... |
| WL2 | — |
| WL3 | — |
| ... | ... |

FIG. 12

Write time table
(Blk:#0, Page:Lower)

| WL | Write Time |
|---|---|
| 0 | Nov. 24, 2020 18:00 |
| 1 | Nov. 27, 2020 9:10 |
| ... | ... |

Write time table
(Blk:#1, Page:Lower)

| WL | Write Time |
|---|---|
| ... | ... |
| 2 | Nov. 24, 2020 19:00 |
| 3 | Nov. 27, 2020 9:00 |
| ... | ... |

| History Information (Blk: #0) | |
|---|---|
| Address | Historical Value |
| WL0 | #0 |
| WL1 | #1 |
| ... | ... |

| History Information (Blk: #1) | |
|---|---|
| Address | Historical Value |
| ... | ... |
| WL2 | #0 |
| WL3 | #1 |
| ... | ... |

FIG. 14

| Page | WL | Blk # | Group # |
|---|---|---|---|
| Lower | 0 | #0 | #0 | ← First Day
| | 1 | #0 | #1 | ← Second Day
| | ... | #0 | #2 | ← Third Day
| | 7 | #0 | #3 | ← Fourth Day
| | 8 | #0 | #4 |
| | ... | #0 | #5 |
| Middle | 0 | #0 | #0 | ← First Day
| | 1 | #0 | #1 | ← Second Day
| | ... | #0 | #2 | ← Third Day
| | 7 | #0 | #3 | ← Fourth Day
| | 8 | #0 | #4 |
| | ... | #0 | #5 |

← 510

| Page | WL | Blk # | Group # |
|---|---|---|---|
| Lower | 0 | #0 | #0 |
| | 1 | #0 | #0 |
| | ... | #0 | #0 |
| | 7 | #0 | #0 |
| | 8 | #0 | #4 |
| | ... | #0 | #5 |
| Middle | 0 | #0 | #0 |
| | 1 | #0 | #0 |
| | ... | #0 | #0 |
| | 7 | #0 | #0 |
| | 8 | #0 | #4 |
| | ... | #0 | #5 |

← 510

| Page | WL | Blk # | Group # |
|---|---|---|---|
| Lower | 0-7 | #0 | #0 |
| | 8 | #0 | #4 |
| | ... | #0 | #5 |
| Middle | 0-7 | #0 | #0 |
| | 8 | #0 | #4 |
| | ... | #0 | #5 |

Write time table (Blk:#0, Page:Lower) 400-0

| Address | Group # |
|---|---|
| WL0 | #0 |
| ⋮ | ⋮ |
| WL192 | #1 |
| ⋮ | ⋮ |
| WL288 | #2 |
| ⋮ | ⋮ |

↖ 410-0

Write time table (Blk:#1, Page:Lower) 400-1

| Address | Group # |
|---|---|
| WL0 | #0 |
| ⋮ | ⋮ |
| WL24 | #1 |
| ⋮ | ⋮ |
| WL48 | #2 |
| ⋮ | ⋮ |
| WL72 | #3 |
| ⋮ | ⋮ |

↖ 410-1

420

| Group # | WL Address for History Group Changed |
|---|---|
| #0 | 192, 288 |
| #1 | 24, 48, 72, 96, 120, 244, 168, 192, 216, 240, 264, 288, 312, 336, 360 |
| ⋮ | ⋮ |

FIG. 18

| History Group Table (Blk #0) | | |
|---|---|---|
| Group # | Table # | Index # |
| #0 | #0 | #4 |
| #1 | #0 | #3 |
| #2 | #0 | #2 |
| ... | ... | ... |
| #n | #0 | #0 |

500-1 ← 510

| History Group Table (Blk #0) | | |
|---|---|---|
| Group # | Table # | Index # |
| #0 | #0 | #4 |
| #1 | #0 | #4 |
| #2 | #0 | #2 |
| ... | ... | ... |
| #n | #0 | #0 |

500-2 ← 510

| History Group Table (Blk #0) | | |
|---|---|---|
| Group # | Table # | Index # |
| #0・#1 | #0 | #4 |
| #2 | #0 | #2 |
| ... | ... | ... |
| #n | #0 | #0 |

500-5
History Group Table (Blk #0)

| Group # | Table # | Index # |
|---|---|---|
| #0 | #0 | #4 |
| #1 | #0 | #3 |
| #2 | #0 | #2 |
| ... | ... | ... |
| #n | #0 | #0 |

← 510

400-4
Write time table (Blk:#0, Page:Lower)

| Address | Group # |
|---|---|
| WL0 | #0 |
| WL1 | #0 |
| WL2 | #1 |
| ... | ... |
| ... | ... |

500-4
History Group Table (Blk #0)

| Group # | Table # | Index # |
|---|---|---|
| #0 | #0 | #4 |
| #1 | #0 | #3 |
| #2 | #0 | #2 |
| ... | ... | ... |
| #n | #0 | #0 |

← 510

500-4

| History Group Table (Blk #0) | | |
|---|---|---|
| Group # | Table # | Index # |
| #0 | #0 | #4 |
| #1 | #0 | #3 |
| #2 | #0 | #2 |
| ... | ... | ... |
| #n | #0 | #0 |

520

| Exception | Table # | Index # |
|---|---|---|
| WL2 | #0 | #3 |
| ... | | |

510

MEMORY SYSTEM WITH A MEMORY CONTROLLER PERFORMING READ OPERATIONS USING INDEXED PARAMETERS BASED ON A TIME DIFFERENCE BETWEEN WRITE OPERATIONS

CROSS-REFERENCE TO RELATED APPLICATION

This application is based upon and claims the benefit of priority from Japanese Patent Application No. 2021-045228, filed Mar. 18, 2021, the entire contents of which are incorporated herein by reference.

FIELD

Embodiments described herein relate generally to a memory system including a non-volatile memory.

BACKGROUND

Recently, a memory system including a non-volatile memory has become widespread. An example of such a memory system is a solid-state drive (SSD) including a NAND flash memory.

BRIEF DESCRIPTION OF THE DRAWINGS

FIG. 3 depicts a shift table used in a memory system according to an embodiment.

FIG. 4 depicts a write time table used in a memory system according to an embodiment.

FIG. 5 depicts a history group table used in a memory system according to an embodiment.

FIG. 6 depicts a history table used in a memory system according to an embodiment.

FIG. 11 is a diagram for illustrating a method of estimating a read condition using history information of a different read group, in a memory system according to an embodiment.

FIG. 12 is a diagram for illustrating a method of estimating a read condition using history information of a different read group, in a memory system according to an embodiment.

FIG. 13 is a diagram for illustrating a method of estimating a read condition using history information of a different read group, in a memory system to an embodiment.

FIG. 14 is a diagram for illustrating updates of a read group according to a read condition, in a memory system according to an embodiment.

FIG. 15 is a diagram for illustrating a method of compressing a write time table used in a memory system according to an embodiment.

FIG. 18 is a diagram for illustrating updates of a history table in a memory system according to an embodiment.

FIG. 20 is a diagram for illustrating updates of a history table in a memory system according to an embodiment.

DETAILED DESCRIPTION

Figure 1:
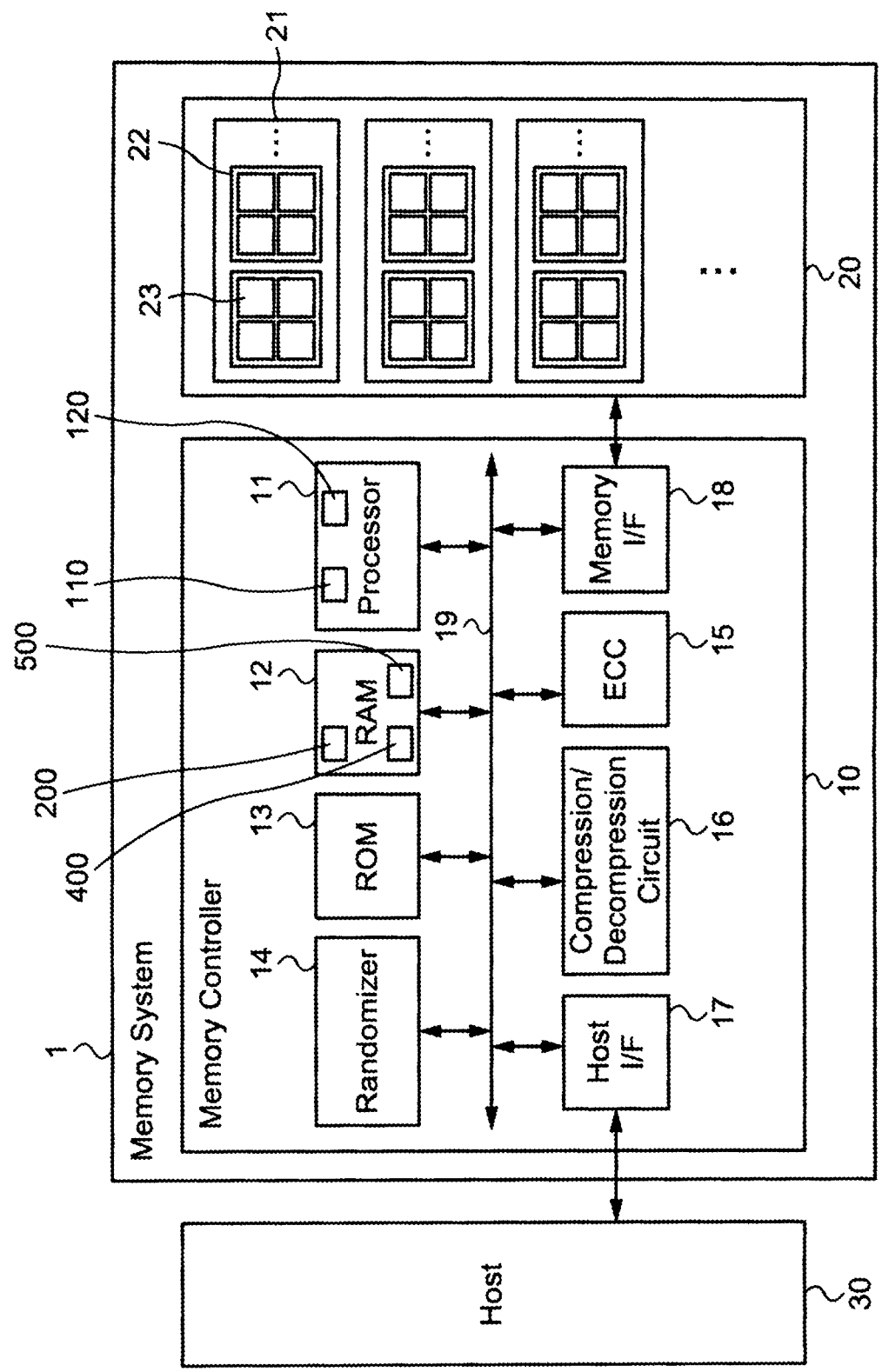
FIG. 1 is a block diagram of a memory system according to an embodiment.

Embodiments provide a memory system for which operations are speeded up.

In general, according to one embodiment, a memory system includes a non-volatile memory in which data can be stored in a plurality of pages including a first page and a second page and a memory controller. The controller is configured to perform a first write operation on the first page at a first time, perform a second write operation on the second page at a second time after the first time, perform a first read operation on the first page at a time after the first time using a first parameter and store a first index value in association with the first page and the first parameter, and determine a second parameter for a second read operation to be performed on the second page using a time difference between the first time and the second time and the first index value stored in association with the first page.

Hereinafter, memory systems according to certain example embodiments will be specifically described with reference to the drawings. In the following description, elements having substantially the same function and configuration are designated by the same reference numerals, and duplicate descriptions may be omitted. Each of the following embodiments exemplifies devices and methods for describing the technical concepts of the present disclosure. The embodiments of the present disclosure are not limited to the particular the materials, shapes, structures, arrangements, and the like of the components in the example embodiments below. And such details may be variously changed or modified and still be within the scope of present disclosure.

The following embodiments may be combined with each other in some examples.

First Embodiment

A memory system according to a first embodiment will be described. The memory system according to the first embodiment includes, for example, a NAND flash memory as a semiconductor storage device and a memory controller for controlling the NAND flash memory. In the first embodiment, the memory controller has a function of controlling a read operation, a write operation, and the like on the memory. During the write operation on the memory, the memory controller stores either a time at which the write operation was performed or a time difference from a reference time. The memory controller sets a condition for the read operation based on the stored time (or the stored time difference) to be used during the read operation on the memory.

1-1. Overall Configuration of Memory System 1

FIG. 1 is a block diagram of a memory system 1 according to an embodiment. As illustrated in FIG. 1, the memory system 1 includes a memory controller 10 and a non-volatile memory 20 including a plurality of memory cells. The memory system 1 may be connected to a host 30. FIG. 1 illustrates the memory system 1 and the host 30 that are connected to each other. The host 30 is, for example, an electronic apparatus such as a personal computer or a mobile terminal.

The non-volatile memory 20 includes a plurality of memory chips 21. The memory controller 10 controls each of the plurality of memory chips 21. Specifically, the memory controller 10 performs a data write operation and a data read operation for each of the memory chips 21. Each of the plurality of memory chips 21 is connected to the memory controller 10 through a NAND bus. Each of the memory chips 21 includes a plurality of dies 22. The die 22 means a wafer unit on which memory cells are formed. The memory chip 21 is formed by a plurality of dies 22. Each of the dies 22 includes a plurality of memory blocks 23. The memory block 23 is a unit that can be erased at once. All memory cell transistors provided in the memory block 23 are connected to the same source line. One unit of the memory block 23 may be referred to as a "physical block". Further, the memory cell transistor may be simply referred to as a "memory cell".

The non-volatile memory 20 is a non-volatile memory that stores data non-volatilely, and is, for example, a NAND flash memory (hereinafter, simply referred to as a NAND memory). It is noted that a semiconductor storage device other than the NAND memory such as a three-dimensional structure flash memory, a resistance random access memory (ReRAM), and a ferroelectric random access memory (Fe-RAM) may be used as the non-volatile memory 20. The present embodiment may be applied to various storage media other than the semiconductor storage device.

The memory system 1 may be a memory card or the like in which the memory controller 10 and the non-volatile memory 20 are disposed in one package or may be a solid-state drive (SSD) or the like.

The memory controller 10 is a semiconductor integrated circuit such as a system-on-a-chip (SoC). A part or all of operations of each element of the memory controller 10 to be described below is implemented by hardware or circuitry. It is noted that the operations may be performed by a processor such as a central processing unit (CPU) configured to execute firmware or software.

The memory controller 10 controls a write operation to the non-volatile memory 20 according to a write request from the host 30 and controls a read operation from the non-volatile memory 20 according to a read request from the host 30. The memory controller 10 includes a processor 11, a random access memory (RAM) 12, a read only memory (ROM) 13, a randomizer 14, an error correction code (ECC) circuit 15, a compression/decompression circuit 16, a host interface (I/F) 17, and a memory interface (I/F) 18. These functional blocks are connected to each other by an internal bus 19.

The processor 11 controls each component of the memory system 1. Upon receipt a request from the host 30 via the host interface 17, the processor 11 performs a control in accordance with the request. For example, the processor 11 instructs the memory interface 18 to write data to the non-volatile memory 20 according to the write request from the host 30. The processor 11 instructs the memory interface 18 to perform a read operation of data from the non-volatile memory 20 according to the read request from the host 30.

Upon receipt of the write request from the host 30, the processor 11 determines a storage region or a memory region in the non-volatile memory 20 for the data stored in the RAM 12. That is, the processor 11 manages a data write destination. A correspondence between a logical address of data received from the host 30 and a physical address indicating the storage region in the non-volatile memory 20 in which the data is stored is stored in an address conversion table. When performing a write operation in accordance with the write request, the processor 11 stores a time when the write operation is performed or a time difference from certain reference time in a write time table of the RAM 12.

Upon receipt of a read request from the host 30, the processor 11 converts a logical address designated by the read request into a physical address using the above-described address conversion table and instructs the memory interface 18 to perform a read operation from the physical address.

As illustrated in FIG. 1, the processor 11 functions as a historical value management unit 110 and a patrol management unit 120 by executing one or more programs. The historical value management unit 110 manages a shift table 200, a write time table 400, and a history group table 500, which will be described below. Further, when performing a read operation in accordance with a read request, the historical value management unit 110 sets a condition (parameter) value for the read operation based on the history group table 500 for managing time or a time difference stored in the write time table and a condition (parameter) value that was successful for the read operation in the past (e.g., a historical value). The patrol management unit 120 performs a read inspection for the non-volatile memory 20 as background processing separately from a request from the host 30 and checks a previous read condition (e.g., a historical value) of memory cells in the non-volatile memory 20.

In a NAND memory, the write operation and the read operation are generally performed in a data unit referred to as a "page", and data is erased in such a data unit. In the following description, a "page" refers to the smallest unit in the write operation. A plurality of memory cells connected to the same word line will be referred to as a "memory cell group". When a memory cell is a single-level cell (SLC), one page includes one memory cell group. In a case of a multi-bit cell such as a multi-level cell (MLC) including one memory cell group configuring two pages, a triple-level cell (TLC) including one memory cell group configuring three pages, or a quad-level cell (QLC) including one memory cell group configuring four pages, one memory cell group corresponds to a plurality of pages. Each memory cell is connected to both a word line and a bit line. Therefore, it is possible to identify each memory cell by using an address for identifying the word line and an address for identifying the bit line.

The RAM 12 is used as, for example, a data buffer, and temporarily stores data received from the host 30 by the memory controller 10 until the received data is stored in the non-volatile memory 20. The RAM 12 temporarily stores data read from the non-volatile memory 20 until the read data is transmitted to the host 30. For example, a general-purpose memory such as static random access memory (SRAM) or dynamic random access memory (DRAM) may be used as the RAM 12.

The RAM 12 stores a shift table 200, a write time table 400, and a history group table 500. In addition to the above-described tables, the RAM 12 stores an address conversion table, various management tables such as a master table (snapshot) read from a specific region of the non-volatile memory 20 at boot up to be deployed, log information which is a change difference between various management tables, and the like. The RAM 12 may be used as a working memory. Among the tables stored in the RAM 12, the shift table 200, the write time table 400, and the history group table 500 will be particularly described below.

The ROM 13 stores various programs, parameters, and the like for operating the memory controller 10. The programs, parameters, and the like stored in ROM 13 are read into the processor 11 to be executed as necessary.

The randomizer 14 includes, for example, a linear feedback shift register and the like, and generates a pseudo-random number uniquely obtained from an input seed value. For example, the processor 11 calculates an exclusive logical sum of the pseudo-random numbers generated by the randomizer 14 and the write data. Thereby, the write data written to the non-volatile memory 20 is randomized. Further, the randomizer 14 cancels randomization of the data read from the non-volatile memory 20. Canceling the randomization means obtaining original data before randomization from the randomized data.

The ECC circuit 15 performs ECC coding (i.e., error correction coding) during a write operation and ECC decoding (i.e., error correction decoding) during a read operation, based on an instruction from the processor 11. A coding method using, for example, a low-density parity-check (LDPC) code, a Bose-Chaudhuri-Hocquenghem (BCH) code, or a Reed-Solomon (RS) code may be adopted as a coding method performed by the ECC circuit 15.

The compression/decompression circuit 16 operates as an encoder that compresses data written to the non-volatile memory 20. The compression/decompression circuit 16 also operates as a decoder that decompresses data read from the non-volatile memory 20.

The host interface 17 performs processing according to an interface standard between the host 30 and the host interface 17. The host interface 17 outputs a request received from the host 30, write target data, and the like to the internal bus 19. The host interface 17 reads data from the non-volatile memory 20 and transmits data decompressed by the compression/decompression circuit 16 to the host 30. The host interface 17 transmits a response and the like from the processor 11 to the host 30.

The memory interface 18 performs a write operation to the non-volatile memory 20 based on an instruction of the processor 11. The memory interface 18 performs a read operation from the non-volatile memory 20 based on an instruction of the processor 11.

Data transmitted from the host 30 to the host interface 17 is transmitted to the internal bus 19 to be temporarily stored in the RAM 12. The data is compressed by the compression/decompression circuit 16, randomized by the randomizer 14, and error-corrected and coded by the ECC circuit 15. Thereafter, the data is written to the non-volatile memory 20 through the memory interface 18. That is, the processor 11 writes data to the non-volatile memory 20 based on the data transmitted from the host 30. Meanwhile, data read from the non-volatile memory 20 is error-corrected and decoded by the ECC circuit 15. Thereafter, the randomizer 14 cancels randomization of the data, the compression/decompression circuit 16 decompresses the data, and thus, original data is recovered from the decompressed data. The recovered data is temporarily stored in, for example, the RAM 12, and then transmitted to the host 30 through the host interface 17. That is, the processor 11 transmits data to the host 30 based on the data read from the non-volatile memory 20. The data compressed and decompressed by the compression/decompression circuit 16 and/or the data of which randomization and cancellation of randomization is performed by the randomizer 14 and/or the data coded by the ECC circuit 15 include control data and the like used in the memory controller 10 in addition to the data.

In the write operation of the memory system 1 including the configuration described above, the processor instructs the compression/decompression circuit 16 to compress data when a write operation to the non-volatile memory 20 is performed. At this time, the processor 11 determines a storage location (or a storage address) of the write data in the non-volatile memory 20 and informs the memory interface 18 of the determined storage location. The compression/decompression circuit 16 compresses data of the RAM 12 based on an instruction from the processor 11. Then, the randomizer 14 randomizes the compressed data of the RAM 12 based on an instruction from the processor 11. Then, the ECC circuit 15 further ECC-codes the randomized data based on an instruction from the processor 11. The write data generated thereby is written to a designated storage location of the non-volatile memory 20 through the memory interface 18.

In the read operation, the processor 11 designates an address in the non-volatile memory 20 during a read operation for the non-volatile memory 20, sets a condition (parameter) value for the read operation of the memory cell according to the designated address to instruct the memory interface 18 to perform the read operation. The processor instructs the ECC circuit 15 to start ECC decoding, instructs the randomizer 14 to start cancellation of randomization, and instructs the compression/decompression circuit 16 to start decompression. The memory interface 18 performs a read operation for the designated address of the non-volatile memory 20 according to an instruction of the processor 11, and inputs read data obtained by the read operation to the ECC circuit 15. The ECC circuit 15 ECC-decodes the read data which is inputted. The randomizer 14 performs cancellation of randomization for the ECC-decoded data. The compression/decompression circuit 16 decompresses the data of which randomization is canceled. When the decompression is successful, the processor 11 stores the decompressed original data in the RAM 12. Meanwhile, when the ECC decoding or the cancellation of randomization or the decompression fails, the processor 11 notifies, for example, the host 30 of a read error.

1-2. Threshold Voltage Distribution of Memory Cell Transistor

Figure 2:
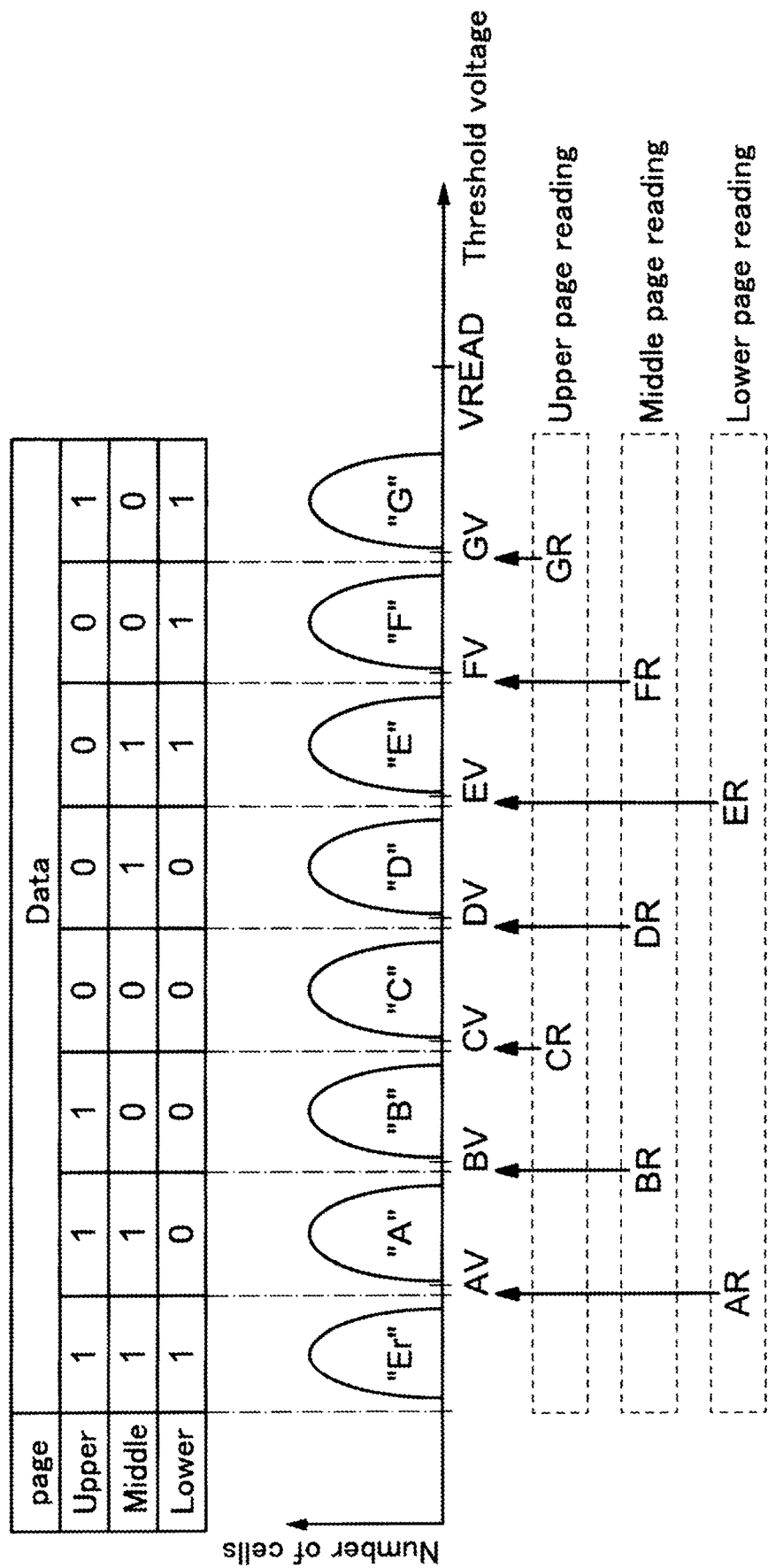
FIG. 2 is a diagram illustrating a threshold voltage distribution of memory cell transistors according to an embodiment.

FIG. 2 is a diagram illustrating a threshold voltage distribution of a transistor used as a memory cell according to an embodiment. FIG. 2 illustrates a TLC as an example of the threshold voltage distribution of the memory cell transistor. Alternatively, a QLC, an MLC, and an SLC may be used in the memory system 1.

FIG. 2 illustrates a threshold voltage distribution of the memory cell transistors. A vertical axis of the threshold voltage distribution illustrated in FIG. 2 corresponds to the number of memory cell transistors (i.e., the number of cells), and a horizontal axis thereof corresponds to threshold voltages Vth of the memory cell transistors.

As illustrated in FIG. 2, in a TLC system, a plurality of memory cell transistors form eight threshold voltages are used for distributions. The eight threshold voltage distributions may be referred to as write states. The write states are referred to as an "Er" state, an "A" state, a "B" state, a "C" state, a "D" state, an "E" state, an "F" state, and a "G" state sequentially from the lowest threshold voltage. Different 3-bit data are assigned to the write states, for example, as illustrated below. The 3-bit data is referred to as a low-level bit (Lower), a mid-level bit (Middle), and a high-level bit (Upper).

A set of Lower bits stored in the memory cell transistors connected to the same word line is referred to as a Lower page, a set of Middle bits is referred to as a Middle page, and a set of Upper bits is referred to as an Upper page. A data write operation and a data read operation are performed in page units (that is, a page is the minimum unit in such operations).

"Er" state: "111" data
"A" state: "110" data
"B" state: "100" data
"C" state: "000" data
"D" state: "010" data
"E" state: "011" data
"F" state: "001" data
"G" state: "101" data The data is described in the order of Upper, Middle, and Lower.

Verification voltages used for a write operation are respectively set between adjacent threshold voltage distributions. Specifically, verification voltages AV, BV, CV, DV, EV, FV, and GV are set corresponding to the "A" state, "B" state, "C" state, "D" state, "E" state, "F" state, and "G" state, respectively.

For example, the verification voltage AV is set between a maximum threshold voltage of the "Er" state and a minimum threshold voltage of the "A" state. When the verification voltage AV is applied to memory cell transistors, memory cell transistors whose threshold voltages are included in the "Er" state are turned on, and memory cell transistors of which threshold voltages are higher than or equal to the "A" state are turned off.

The other verification voltages BV, CV, DV, EV, FV, and GV are also set in the same manner as the verification voltage AV. The verification voltage BV is set between the "A" state and the "B" state. The verification voltage CV is set between the "B" state and the "C" state. The verification voltage DV is set between the "C" state and the "D" state. The verification voltage EV is set between the "D" state and the "E" state. The verification voltage FV is set between the "E" state and the "F" state. The verification voltage GV is set between the "F" state and the "G" state.

For example, the verification voltage AV may be set to 0.8 V, the verification voltage BV may be set to 1.6 V, the verification voltage CV may be set to 2.4 V, the verification voltage DV may be set to 3.1 V, the verification voltage EV may be set to 3.8 V, the verification voltage FV may be set to 4.6 V, and the verification voltage GV may be set to 5.6 V. However, the verification voltages AV to GV are not limited to these voltage values. The verification voltages AV to GV may be set appropriately and step by step in a range of, for example, 0.0 V to 7.0 V.

Read voltages used for read operations are set between adjacent threshold voltage distributions. For example, a read voltage AR that determines whether threshold voltages of memory cell transistors are included in the "Er" state or are included in the "A" state or higher is set between a maximum threshold voltage of the "Er" state and a minimum threshold voltage of the "A" state.

The other read voltages BR, CR, DR, ER, FR, and GR are set between adjacent states as well as the read voltages AR. For example, the read voltage BR is set between the "A" state and the "B" state. The read voltage CR is set between the "B" state and the "C" state. The read voltage DR is set between the "C" state and the "D" state. The read voltage ER is set between the "D" state and the "E" state. The read voltage FR is set between the "E" state and the "F" state. The read voltage GR is set between the "F" state and the "G" state.

A read pass voltage VREAD is set to a voltage value higher than a maximum threshold voltage of the highest threshold voltage distribution (for example, "G" state). Memory cell transistors having a gate to which the read pass voltage VREAD is applied are turned on regardless of the data to be stored.

The verification voltages AV, BV, CV, DV, EV, FV, and GV are set to higher voltages than the read voltages AR, BR, CR, DR, ER, FR, and GR, respectively. That is, the verification voltages AV to GV are set near a lower end of the threshold voltage distributions of the "A" state, "B" state, "C" state, "D" state, "E" state, "F" state, and "G" state, respectively.

When the above-described allocation of data is used, one page data (data of Lower page) of low-level bits in the read operation is determined definitely by a read result using the read voltages AR and ER. One page data (data Middle page) of mid-level bits are determined definitely by a read result using the read voltages BR, DR, and FR. One page data of high-level bits (data of Upper page) is determined definitely by a read result using the read voltages CR and GR. As such, since data of the Lower page, the Middle page, and the Upper page are determined definitely by read operations of two times, three times, and two times, respectively, allocation of this data is referred to as a "2-3-2 code".

1-3. Management Table

An example of a management table stored in the RAM 12 will be described with reference to FIGS. 3 to 5.

1-3-1. Shift Table 200

FIG. 3 depicts a shift table 200 used in the memory system 1 according to an embodiment. As illustrated in FIG. 3, a shift table 200 has m+1 entries. Here, m is an integer greater than or equal to 1. Indices of "#0" to "#m" are assigned to the respective entries. Each entry stores information on a read voltage applied to a selected word line or a shift value of the read voltage, in the read voltages AV to GV. In the example of FIG. 3, a "read value immediately after write" is associated with the index "#0". Likewise, a "read value after one day" is associated with the index "#1". A "read value after three days" is associated with the index "#2". The value associated with each index illustrated in FIG. 3 is managed as a read condition of memory cells in the non-volatile memory 20 in another table. Therefore, each value stored in the shift table 200 may be referred to as a "historical value". FIG. 3 illustrates indices and shift values of the shift table "#0". Indices and shift values different from the indices and shift values of FIG. 3 are associated with each other in another shift table 200.

As described above, each of the "Er" state to the "G" state illustrated in FIG. 2 can be distinguished by the read voltages "AR" to "GR". However, as time elapses after data is written, the threshold voltage distribution may be shifted to a lower voltage side due to a decrease in the amount of charges stored due to leakage and an interference between adjacent memory cell transistors (hereinafter referred to as the interference effect between cells). The shift amount is increased as time elapses after data has been written to the memory cell transistor and is increased for blocks as the number of times of writing to the block increases. In general, a width of the threshold voltage distribution of each state is increased, and the threshold voltage distribution may thus overlap the read voltage set to the lower voltage side of the threshold voltage distribution for each state.

As described above, when the threshold voltage distribution varies due to the interference effect between cells, data may not be read correctly at the above-described read voltages "AR" to "GR". That is, an error is notified to a target bit for which a read operation was performed. When the number of error bits exceeds the number of bits that can be corrected by the ECC circuit 15, it is determined that the read operation of data fails.

When the threshold voltage distribution varies as described above, the memory controller 10 shifts the read voltage from "AR" to "GR" in FIG. 2 to a lower voltage side and tries the read operation of data again. The read operation of this type is referred to as a shift read. The shifted amount is set to the shift value of FIG. 3 for the read voltages "AR" to "GR". In other words, a plurality of parameters (e.g., read voltages "AR" to "GR") are set to the shift value in FIG. 3. Then, determination of the index # in the shift table 200 means that values for the above-described plurality of parameters are determined.

1-3-2. Write Time Table 400

FIG. 4 depicts a write time table 400 used in the memory system 1 according to an embodiment. As illustrated in FIG. 4, in the write time table 400, an address of each of word lines WL in a particular block (Blk) and write time (Write Time) when a write operation is performed for the word line WL are managed in association with each other. In FIG. 4, write time is stored in a unit of a word line. In other words, since a plurality of pages belong to a word line, write time is stored in a unit of a group of pages. However, the write time may be stored in a unit of a page.

In FIG. 4, a page belonging to a word line WL0 may be referred to as a "first page", and a group of first pages belonging to the word line WL0 may be referred to as a "first page group". Further, when a write operation is collectively performed for a page belonging to the word line WL0 in a certain block and a page belonging to the word line WL0 in another block, these pages can also be referred to as the first page group. Likewise, a page belonging to a word line WL1 may be referred to as a "second page", and a group of second pages belonging to the word line WL1 may be referred to as a "second page group". A write operation for the first page or the first page group may be referred to as a "first write operation". A write operation for the second page or the second page group may be referred to as a "second write operation". A read operation for the first page or the first page group may be referred to as a "first read operation". A read operation for the second page or the second page group may be referred to as a "second read operation". A time when the first write operation is performed may be referred to as a "first time". A time when the second write operation is performed may be referred to as a "second time".

In the above-described case, the write time table 400 stores the address of the first page or the first page group and a first time $t_0$ at which the first write operation is performed in association with each other. Likewise, the write time table 400 stores the address of the second page or the second page group and a second time $t_1$ at which the second write operation is performed in association with each other.

Likewise to the above description, a page belonging to a word line WL7 may be referred to as a "third page", and a group of third pages belonging to the word line WL7 may be referred to as a "third page group". A write operation for the third page or the third page group may be referred to as a "third write operation". A read operation for the third page or the third page group may be referred to as a "third read operation". A time when the third write operation is performed may be referred to as a "third time".

The write time table 400 illustrated in FIG. 4 illustrates an example in which write times for all the word lines WL are stored. When the word lines WL0 to WL7 and word lines WL8 to WL15 are each defined as one read group, the write times for all the word lines WL may not be stored. For example, a time for only one word line (for example, word lines WL0, WL8, . . . ) for each read group may be stored, and time for some of the word lines (for example, even-numbered word lines WL0, WL2, WL4, . . . ) of the read group may be stored. Word lines of which times are stored may not be word lines having equal intervals.

The write time table 400 may store a time difference between a certain reference time and a time when the write operation is performed, instead of the write time. For example, the write time $t_0$ may be stored for the first word line WL0 in the block, and a time difference between the write time $t_0$ in the word line WL0 and each of the write times ($t_1$ to $t_N$) for the other word lines WL1 to WLN may be stored. Here, N is an integer greater than or equal to 1. In the following description, the write time and the time difference may be collectively referred to as "write time information".

1-3-3. History Group Table 500

FIG. 5 depicts a history group table 500 used in the memory system 1 according to an embodiment. As illustrated in FIG. 5, a history group 510 (Group #) determined based on the write time information, the shift table 200 (Table #) assigned to each group, and an index (i.e., a historical value) of the shift table 200 are managed in association with each other in the history group table 500. In the example of FIG. 5, the history group table 500 has n+1 history groups 510. Here, n is an integer greater than or equal to 1. The history group 510 is a collection of pages for which a write operation was performed within a predetermined period. The values stored in FIG. 5 specify conditions (e.g., shift values) at which a read operation for a target page was successful. Those values may be obtained when a read operation is performed according to a read request from the host 30 or when a read inspection of the non-volatile memory 20 is performed during background processing, separately from the read request. The memory controller 10 sets the read voltage to be applied to selected page and word line WL based on the history group table 500.

For example, pages for which the write operation was completed on the same day are set to be in the same history group 510. Alternatively, in the write time table 400 of FIG. 4, when the time (write time $t_0$) at which the write operation is performed on a page or a page group belonging to the word line WL0 is referred to as a reference time, the word line WL0 and the word lines WL for which a write operation is completed within a predetermined period from the write time $t_0$ are set to be the same history group 510. In other words, when a time difference between the write time $t_0$ of the word line WL0 and the write times ($t_1$ to $t_N$) of other word lines WL is within a predetermined time, the word lines WL are grouped and managed together in the same history group 510. An operation of grouping the word lines based on the write time may be performed during a read operation or may be performed during a write operation.

When grouping is performed during the read operation, a time difference between write times of the respective word lines WL is calculated based on the write times stored in the write time table 400, and the grouping is performed based on the calculated time difference. When the grouping is performed during the write operation, the grouping is performed based on a time difference between a certain reference time (for example, the write time $t_0$ for the first word line WL0 in a target block) and the write time of the target word line WL and is stored in the write time table 400.

1-3-4. History Table 300

FIG. 6 depicts a history table 300 used in the memory system 1 according to an embodiment. The historical value management unit 110 may manage the history table 300 in addition to the history group table 500 and may store the history table 300 in the RAM 12. When the historical value management unit 110 manages the history table 300, the memory controller 10 can determine a read voltage to be applied to a selected page and a word line WL with reference to the history table 300. As illustrated in FIG. 6, block numbers (Blk #), pages (Page), word lines WL, and indices (i.e., historical values) indicated in in the shift table 200 are managed in association with each other in the history table 300. Historical values of FIG. 6 are obtained based on the history group table 500 (see FIG. 5). Pages and word lines WL indicate physical addresses corresponding to the block.

In FIG. 6, each index number shown in FIG. 3 is assigned to a combination of pages and word lines WL. For example, the index "#0" is assigned as a historical value to a combination of the block "#0", the page "Lower", and the word lines "WL0 to WL7". As described above, a same historical value is assigned to a group including the plurality of word lines WL. A group to which a common historical value is assigned in this way may be referred to as a "read group".

As described above, a read operation is performed for the pages belonging to the same read group using the same historical value. For example, historical values obtained for the block "#0", the page "Lower", and the word line "WL0" are also applied to the read operation of the block "#0", the page "Lower", and the word lines "WL1 to WL7".

As illustrated in FIG. 6, the index "#1" is assigned as a historical value to a read group of the block "#0", the page "Lower", and the word lines "WL8 to WL15". That is, different historical values may be assigned to different word lines WL even in the same block.

1-4. Operation Flow

Figure 7:
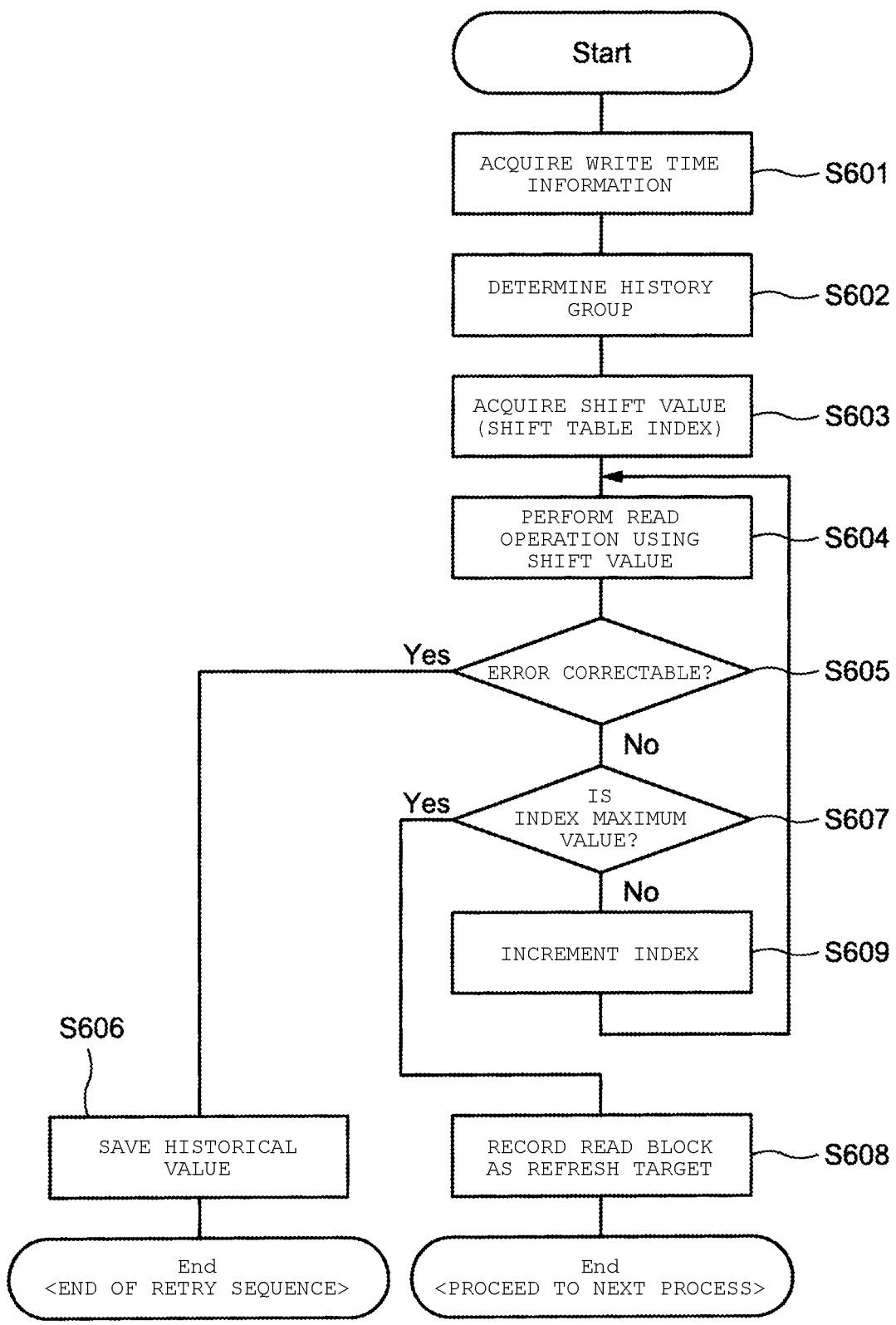
FIG. 7 is a flowchart of a read operation performed by a memory system according to an embodiment.
Figure 9:
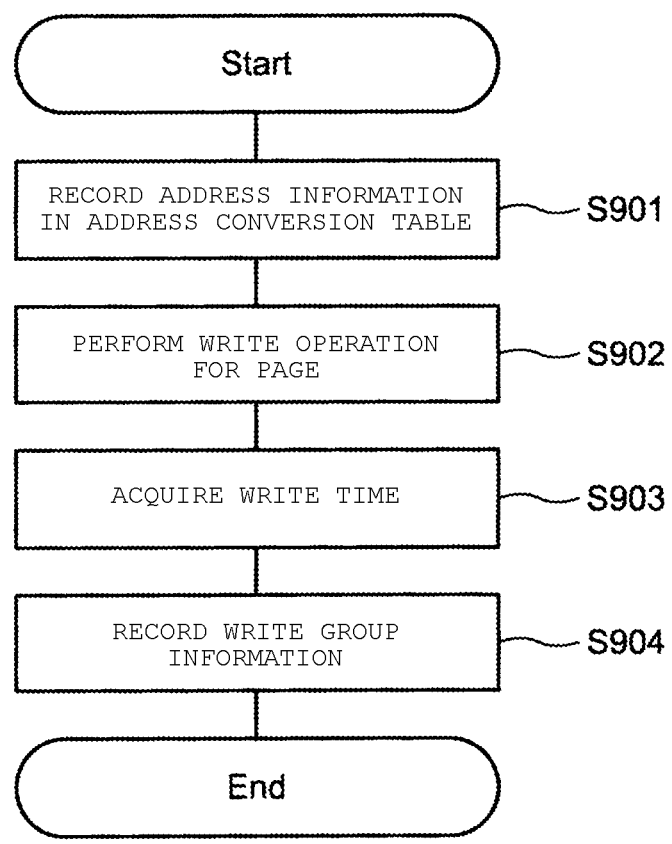
FIG. 9 is a flowchart of a write operation performed by a memory system according to an embodiment.

Flows of the read operation and the write operation of the memory system 1 will be described with reference to FIGS. 7 and 9. FIG. 7 illustrates an operation flow for performing grouping using write time information during a read operation. FIG. 9 illustrates an operation flow for performing grouping using write time information during a write operation.

1-4-1. Read Operation Flow

FIG. 7 is a flowchart of a read operation performed by the memory system 1 according to an embodiment. As illustrated in FIG. 7, the read operation includes steps S601 to S609. The steps are performed by the processor 11 of the memory controller 10. The operations illustrated in FIG. 7 start according to a read request from the host 30 to the non-volatile memory 20. When the read operation starts, a physical address (i.e., page and word line WL) is first specified from logical address information associated with the read request with reference to the address conversion table. Then, write time information corresponding to the physical address is acquired by reference to the write time table 400 illustrated in FIG. 4 (step S601).

In the write time table 400 of FIG. 4, the first time $t_0$ has been stored during the first write operation for the first page or the first page group belonging to the word line WL0. Likewise, the second time $t_1$ has been stored at the time of the second write operation to the second page or the second page group belonging to the word line WL1.

The history group 510 in FIG. 5 is determined based on the write time information acquired in S601 (step S602). Specifically, the history group 510 to which each word line WL belongs is calculated based on the write time of each word line WL. For example, in FIG. 4, when the write time $t_0$ of the word line WL0 at which the first write operation is performed in a certain block is used as a reference time, the history group 510 of the word line WL0 is determined based on a difference between the write time $t_0$ of the word line WL0 and the read time at which the read operation is performed (see FIG. 8). Further, in such a case, the history group 510 of word line WL1 is determined based on a time difference between the write time $t_0$ of the word line WL0 and the write time $t_1$ of the word line WL1 (see FIG. 8). Likewise, the history group 510 of the word line WL2 is determined based on a time difference between the write time $t_0$ of the word line WL0 and the write time $t_2$ of the word line WL2.

The historical value (Index #) of the history group table 500 indicates a condition (parameter) at which a read operation was successful after a write operation for a page or a page group is performed. Hereinafter, the condition (parameter) setting value at which the first read operation for the first page or the first page group (Group #0) performed after the first write operation was successful is referred to as a "first historical value". In the present embodiment, a group that is established based on a difference between the time $t_0$ (when the first write operation is performed for the word line WL0) and the time when the first read operation is performed is referred to as Group #0. It is noted that the present disclosure is not limited thereto. In other words, during the operation of S602 described above, a time difference between the first time $t_0$ and the second time $t_1$ can be first calculated and then a second read condition can be determined for the second page or the second page group (Group #1) performed after the first read operation, based on the calculated time difference and the first historical value (Index #0). That is, a second read condition of the second read operation is determined by calculating the time difference based on the first time $t_0$ and the second time $t_1$. When the same historical value is assigned to the page or the page group belonging to the word lines WL0 to WL7, it can be said that a third read operation for the third page or third page group is performed using the first historical value (or the second historical value) indicating a condition (parameter) at which the first read operation (or the second read operation) was successful.

Figure 8:
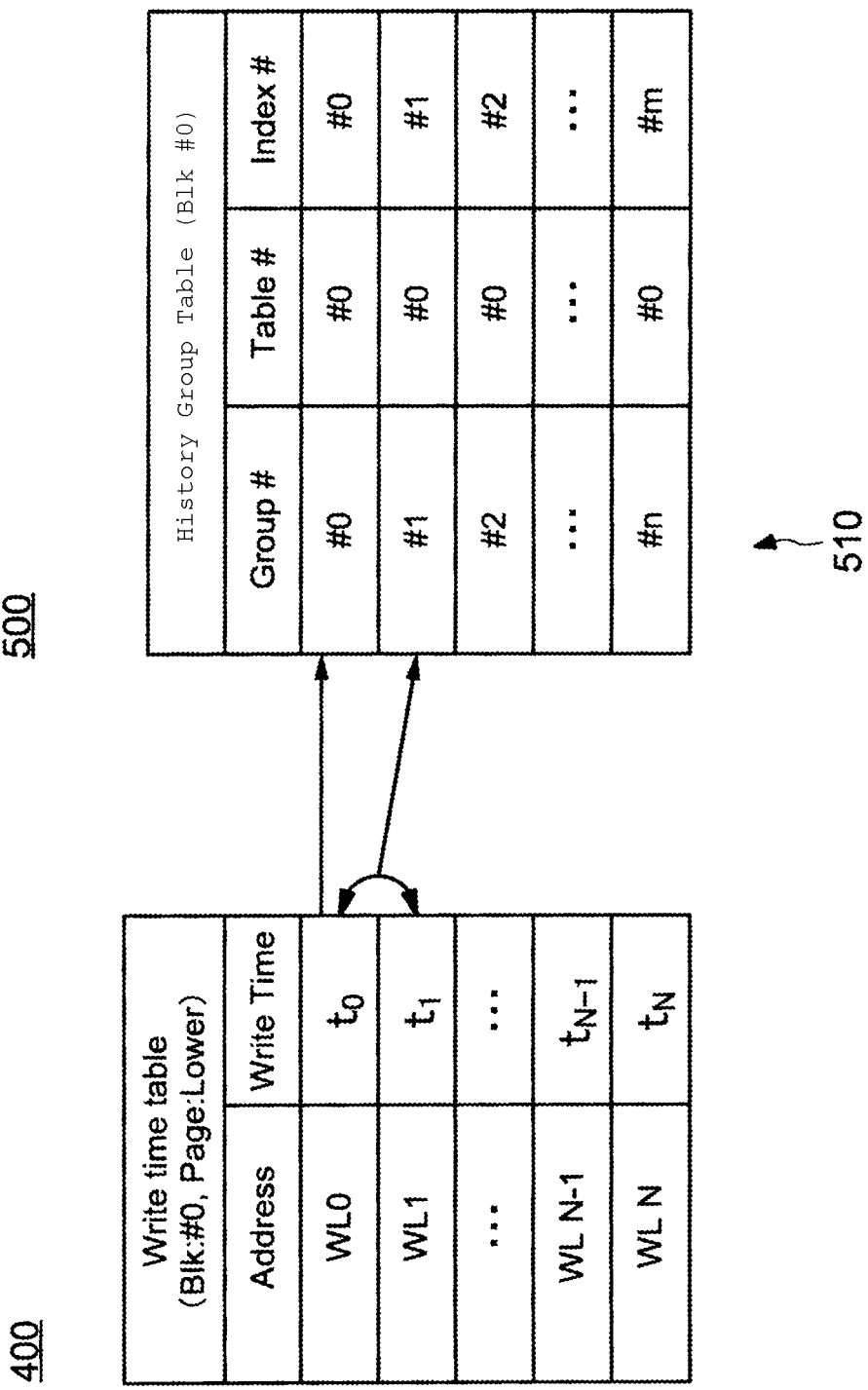
FIG. 8 depicts a relationship between a write time table and a history group table used in a memory system according to an embodiment.

A shift value of the read voltage illustrated in FIG. 3 is acquired based on the history group 510 determined in S602 (step S603). Specifically, when the word line WL1 belongs to the history group 510 "#1" as illustrated in FIG. 8, the shift tables "#0" and the index "#1" are read based on history group table 500. As a result, the "read value after one day" is read as a shift value of a read voltage supplied to the word line WL1 based on shift table 200 illustrated in FIG. 3.

The read operation is performed using the shift value checked in 603 (step S604). When the read data obtained by the read operation is transmitted to the memory controller 10, error detection is performed by the ECC circuit 15 (step S605).

In S605, when an error is not detected by the ECC circuit 15 or the error can be corrected by the ECC circuit 15 ("Yes" in S605), it is determined that the read operation is successful, and the successful shift value is saved as a historical value (step S606), and the read operation is completed (End <End of retry sequence>). For example, in S606, the history group table 500 illustrated in FIG. 5 stores a read condition (respective numbers of a table and indices) when the read operation is successful in association with the Group #. Meanwhile, in S605, when the number of error bits included in the read data exceeds the number of bits that can be corrected by the ECC circuit 15 ("No" in S605), whether the index corresponding to the history group 510 in the history group table 500 is the maximum is determined (step S607).

In S607, when the index corresponding to the history group 510 in the history group table 500 is the maximum value (#m) ("Yes" in S605), the target block of the read operation is recorded as a refresh target (step S608), the operation is shifted to an operation for correctly reading data, such as a Vth tracking operation (End <Proceed to the next process>). Meanwhile, in S607, when the index corresponding to the history group 510 in the history group table 500 is not the maximum value ("No" in S605), the index corresponding to the history group 510 is incremented (step S609), and the operation returns to the step of S604.

1-4-2. Write Operation Flow

FIG. 9 is a flowchart of the write operation performed by the memory system 1 according to an embodiment. As illustrated in FIG. 9, the write operation includes steps S901 to S904. Those steps are performed by the processor 11 of the memory controller 10. The operation illustrated in FIG. 9 starts when a write request is sent from the host 30 to the non-volatile memory 20.

When the write operation starts, information of a logical address of a write target page is first recorded in the address conversion table (step S901). A physical address (i.e., page and word line WL) is specified based on the recorded logical address information. Then, the write operation is performed for the page of the specified physical address (step S902).

Figure 10:
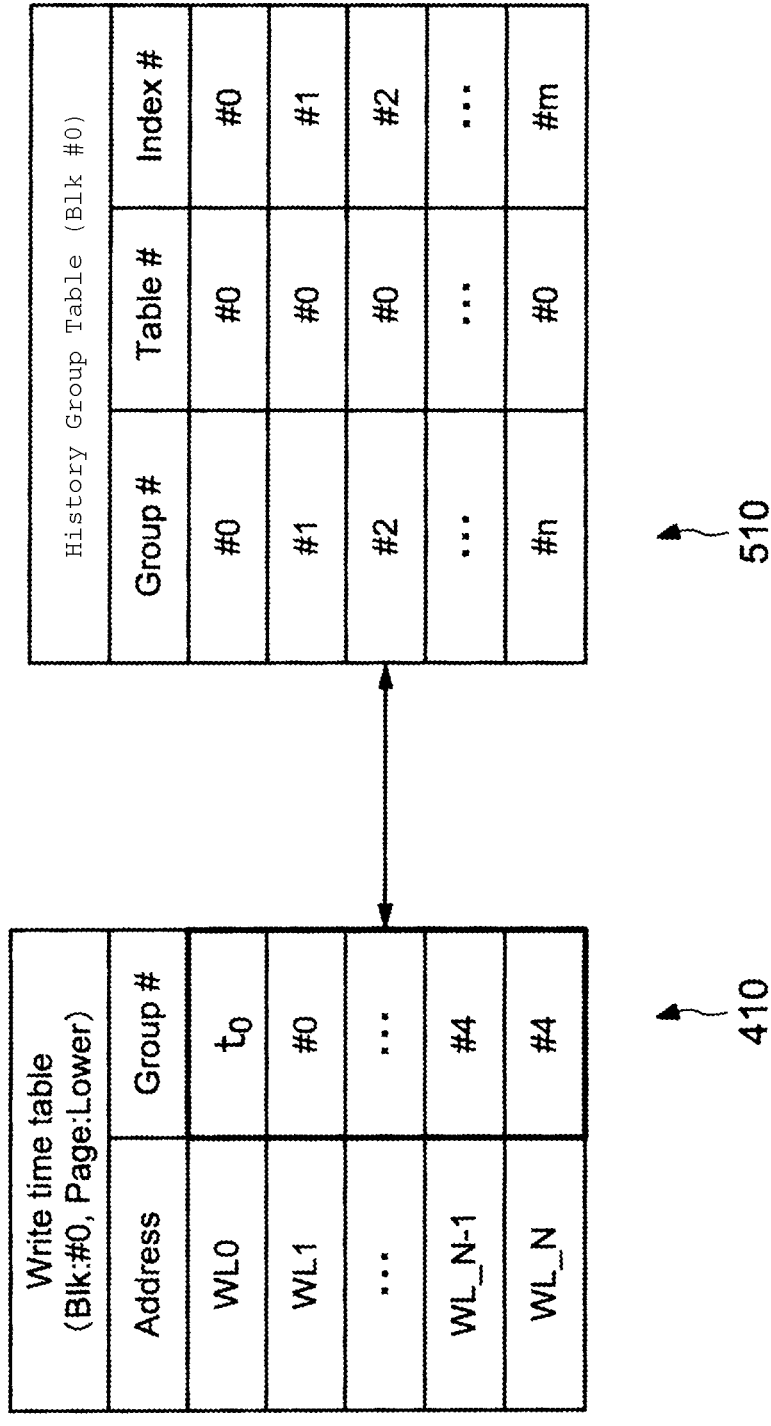
FIG. 10 depicts a relationship between a write time table and a history group table used in a memory system according to an embodiment.

When the write operation performed in S902 is completed, the processor 11 acquires the physical address of the page where the write operation is completed and write time when the write operation is performed (step S903). Subsequently, the processor 11 determines the write group 410 based on a time difference between the write time of the target page and a certain reference time, and records the write group 410 in the write time table 400 (see FIG. 10). FIG. 10 depicts a relationship between the write time table 400 and the history group table 500 used in the memory system according to an embodiment.

In other words, in the operations of S903 and S904 described above, the first time $t_0$ is stored during the first write operation for the first page or the first page group belonging to the word line WL0. During the second write operation for the second page or the second page group belonging to the word line WL1, for example, a time difference between the first time $t_0$ and the second time $t_1$ is calculated and the write group 410 determined based on the time difference is stored.

In addition, unlike the write time table 400 of FIG. 4 used in Section 1-4-1, "Read Flow" described above, addresses of the word lines WL and the write group 410 are managed in association with each other as illustrated in FIG. 10.

The write group 410 is a group having the same concept as the history group 510 illustrated in FIG. 5. That is, the write group 410 is a group obtained by collecting pages for which write operations have been performed within a predetermined period. For example, pages for which the write operations are completed on the same day are set as the same write group 410. Alternatively, in the write time table 400 of FIG. 10, when the write time $t_0$ of the word line WL0 is set as a reference time, the word line WL0 and the word line WL whose write operation is completed within a predetermined period from the write time $t_0$ of the word line WL0 are set as the same write group 410. In other words, when a time difference between the write time $t_0$ of the word line WL0 and the write time of another word line WL is within a predetermined time, the word lines WL are grouped and managed in the same write group 410.

In the write time table 400 of FIG. 10, the write time $t_0$ of the word line WL0 is stored for the word line WL0 as the reference time. Meanwhile, a group # is stored for each of the word lines WL1 to WLN. Here, N is an integer greater than or equal to 1. A group number # of the write group 410 corresponds to a group number # of the history group 510.

When a read operation is performed, a shift value of a read voltage is acquired based on the history group 510 corresponding to the write group 410. Then, the read operation is performed by performing the steps after S603 illustrated in FIG. 7 by using the checked shift value.

As described above, according to the memory system 1 of the present embodiment, even when certain time elapses from completion of the write operation and a threshold voltage Vth of a memory cell transistor varies, a read voltage suitable for the memory cell transistor can be determined before the read operation is performed. Therefore, the number of retries and refreshes during the read operation can be reduced. As a result, the operation of the memory system 1 can be speeded up.

Furthermore, in the operation method described in Section 1-4-1, "Read Flow", the write time for each address is stored in the write time table 400, whereas in the operation method described in Section 1-4-2, "Write Flow", the information stored in the write time table 400 is a value that specifies the write group 410 (see FIG. 10). Thus, the size of the write time table 400 can be reduced in the latter operation method.

Second Embodiment

The memory system 1 according to a second embodiment will be described with reference to FIGS. 11 to 13. The memory system 1 according to the second embodiment is different from the first embodiment in a read operation. In other respects, the second embodiment has the same configuration as the first embodiment, and thus, description thereof is omitted. In the read operation according to the second embodiment, when there is no historical value for a target word line WL including a page to be read, a read voltage for the target word line WL is estimated using a historical value for another non-target word line WL.

FIGS. 11 to 13 are diagrams for illustrating a method of estimating a read condition using history information of another read group in the memory system 1 according to an embodiment. In an example of the second embodiment, as illustrated in FIG. 11, a historical value "#0" exists for a page belonging to the word line WL0 in the block (Blk: #0), and a historical value "#1" exists for a page belonging to the word line WL1, but historical values for the word lines WL2 and WL3 value do not exist in the block (Blk: #1). Under this condition, an operation when there is a read request to the word lines WL2 and WL3 in the block (Blk: #1) will be described.

When read operations for pages belonging to the word lines WL2 and WL3 of Blk: #1 are performed, these read conditions are estimated by reference to the write time table 400 illustrated in FIG. 12. Specifically, a search is performed for the word line WL (i) including a page on which a write operation has been performed at a time within a predetermined range from the write times of each of the word lines WL2 and WL3 and (ii) associated with a historical value in FIG. 11. Alternatively, the word line WL of Blk: #0 is searched for a time difference between a certain reference time and the write time for the word line WL2 or the word line WL3 of Blk: #1 being within a range, that is, a time difference from the reference time is within the range, among the word lines WL associated with the historical values in FIG. 11.

For example, the predetermined range is defined as one hour in the example illustrated in FIG. 12. In FIG. 12, the write time for the word line WL2 of Blk: #1 is "Nov. 24, 2020 19:00," which is within an hour from the write time for the word line WL0, "Nov. 24, 2020 18:00" of Blk: #0. Since the write time for the word line WL0 is associated with a historical value, the word line WL0 is determined as a search result. Likewise, the write time for the word line WL3 of Blk: #1 is "Nov. 27, 2020 9:00," and the time difference from the write time for the word line WL1 of Blk: #0 "Nov. 27, 2020 9:10" is 10 minutes. Since the write time for the word line WL1 is associated with a historical value, the word line WL1 is determined as a search result. Then, the historical value "#0" of the word line WL0 of Blk: #0 is outputted as a historical value of the word line WL2 of Blk: #1, and the historical value "#1" of the word line WL1 of Blk: #0 is outputted as a historical value of the word line WL3 of Blk: #1 (see FIG. 13).

In the above-described configuration, a page belonging to the word line WL2 or WL3 of Blk: #1 may be referred to as a "fourth page", and a group of the fourth page belonging to the word line WL2 or WL3 of Blk: #1 may be referred to as a "fourth page group". A write operation for the fourth page or the fourth page group may be referred to as a "fourth write operation". A read operation for the fourth page or the fourth page group may be referred to as a "fourth read operation". A time when the fourth write operation is performed may be referred to as "fourth time". In the above-described case, when there is no historical value indicating a condition at which the fourth read operation was successful, and when a time difference between the fourth time and the first time (or the second time) is within a predetermined time difference, it can be said that the fourth read operation is performed by using the first historical value (or the second historical value).

As described above, according to the memory system 1 of the second embodiment, even when a read operation is performed for a page where no historical value exists, the historical value can be estimated based on the write time when a write operation has been performed for the page.

The present embodiment has described the case in which write times of the word lines WL are stored in the write time table 400. Alternatively, the write group (group #) may be stored in the write time table 400 for each word line WL as illustrated in FIG. 10. In such a case, it is also possible to use, as a historical value for a word line WL which is a target of a read operation and belonging to a write group, a historical value for another word line WL belonging to the same write group, or a historical value for a word line WL belonging to another write group having a predetermined relationship with the write group including the target word line WL.

Third Embodiment

A memory system 1 according to a third embodiment will be described with reference to FIG. 14. The memory system 1 according to the third embodiment has a different read operation from the first embodiment in that a common history group 510 is assigned to a plurality of word lines WL. In the other respects, the third embodiment has the same configuration as the first embodiment, and thus description thereof is omitted. In FIG. 14, an upper table is a table illustrating a state at a certain time point, and a middle table is a table illustrating a state after a lapse of a certain time (for example, after 10 days) from the certain time point. A lower table illustrates a state in which some entries for word lines assigned to the same history group in the middle table are grouped into a single entry.

As illustrated in FIG. 14, in the memory system 1 according to the present embodiment, a write operation is performed on the first day for the pages "Lower" and "Middle" belonging to the block "#0" and the word line WL0. Likewise, a write operation is performed on the second day for the pages "Lower" and "Middle" belonging to the block "#0" and the word line WL1. A write operation is performed on the third day for the pages "Lower" and "Middle" belonging to the block "#0" and the word line WL . . . . A write operation is performed on the fourth day for the pages "Lower" and "Middle" belonging to the block "#0" and the word line WL7 (see the upper table in FIG. 14).

A variable amount per unit time of the threshold voltage Vth of the memory cell transistor is reduced as elapsed time increases. That is, immediately after writing to the word line WL7 is performed on the fourth day, a difference in the variable amount of the threshold voltage Vth per unit time in each of the memory cell transistors belonging to the word lines WL0 to WL7 is still large, for example, 10 days after the writing on the fourth day, the difference in the variable amount of the threshold voltage Vth per unit time in each of the memory cell transistors belonging to the word lines WL0 to WL7 is reduced significantly. As such, when the variable amount of the threshold voltage Vth per unit time is small, the memory cell transistors belonging to the word lines WL0 to WL7 can be treated as equivalent (see the middle table in FIG. 14). Therefore, in the above-described case, a common history group "#0" can be assigned to the block "#0", the pages "Lower" and "Middle", and the word lines WL0 to WL7 (see the lower table of FIG. 14).

In the above-described configuration, a historical value for the page "Lower" and the word line WL0 is referred to as a first historical value, and a historical value for the page "Lower" and the word line WL1 is referred to as a second historical value. When the first historical value is the same as the second historical value, it can be said that a historical value which is the same as the first historical value and the second historical value is stored as a common historical value common to the word lines WL0 to WL1.

A historical value after certain time elapses from the write operation (e.g., 10 days after) may be obtained by a read operation based on a read request from the host 30 and may be obtained by a read inspection of background processing to be described below separately from the read request. Further, as illustrated in FIG. 2, a plurality of parameters ("A" state to "G" state) are set for read voltage values of the respective memory cell transistors. Determination of the historical value means identification of the plurality of parameters. The identification of the plurality of parameters may be made by a read operation based on a read request from the host 30 or may be made by a read inspection of background processing separate from the read request.

As described above, by assigning the common history group 510 to the plurality of word lines WL, not only the memory size of the history group table 500 can be reduced, but also a retry rate and a refresh rate can be reduced.

The above-described example illustrates the configuration in which the different history groups 510 assigned to the plurality of word lines WL are changed to the common history group 510. It is noted that the present disclosure is not limited to the configuration. For example, immediately after a write operation, or at the time point of a first read operation after the write operation, when it is determined that the common history group 510 is assigned to the plurality of word lines WL, the common history group 510 may be assigned to the plurality of word lines WL at the time points.

Fourth Embodiment

A memory system according to a fourth embodiment will be described with reference to FIG. 15. The memory system according to the fourth embodiment is different from the first embodiment in a configuration of a write time table. In other respects, the fourth embodiment has the same configuration as the first embodiment, and thus description thereof is omitted. The write time table according to the fourth embodiment is obtained by compressing the write time table according to the first embodiment.

As illustrated in FIG. 15, in the fourth embodiment, the write time table 400 is compressed and converted into a compression table 420. The write time table 400 illustrated in FIG. 15 is a table similar to the write time table 400 illustrated in FIG. 10. In a write time table 400-0 for the block "#0", "#0" is assigned as a write group 410 to the word lines WL0 to WL191. Likewise, "#1" is assigned as the write group 410 for the word lines WL192 to WL287. Likewise, "#2" is assigned as a write group 410-0 to the word line WL288 or more. That is, a value of the write group 410-0 changes after word lines WL192 and WL288. Likewise to the above description, in a write time table 400-1 for the block "#1", a value of a write group 410-1 changes after word lines WL24, WL48, WL72, . . . .

As illustrated in FIG. 15, the compression table 420 manages the write group 410 and word line addresses after which values of the write group 410 change in each group in association with each other. As described above, in the write group "#0", values of a group change after the word lines WL192 and WL288, and thus, only numerical values referred to as "192 and 288" for the block "#0" are stored in the compression table 420. Similarly, in the compression table 420, only the numbers "24, 48, 72, . . . " are stored for the block "#1".

In the above-described configuration, a group belonging to each word line WL of the write time table 400-0 is referred to as a "memory group". For example, when there are memory groups (WL0 to WL191, WL192 to WL287, or WL288 or more) with the same read condition among X memory groups in a table (write time table 400-0) in which X read conditions for X memory groups (WL0, . . . , WL192, . . . , WL288, . . . ) are defined, it can be said that the write time table 400-0 is compressed based on the X memory groups or the X read conditions. Here, X is an integer greater than or equal to 1.

As described above, according to the memory system 1 of the present embodiment, the size of a memory required for storing a table can be reduced by using the compression table 420 instead of the write time table 400.

Fifth Embodiment

A memory system according to a fifth embodiment will be described with reference to FIGS. 16 to 21. The memory system according to the fifth embodiment performs a read inspection of the non-volatile memory 20 as separate background processing separately from a read operation in accordance with a read request from the host 30. Then, the history group table 500 is updated according to the inspection result. Historical values of the pages in each block are inspected by the above-described read inspection, and the historical values are updated as necessary. Since the inspection for the historical values is repeatedly performed as background processing, the inspection may be referred to as a historical value loop inspection.

5-1. Overall Configuration of Memory System 1

Figure 16:
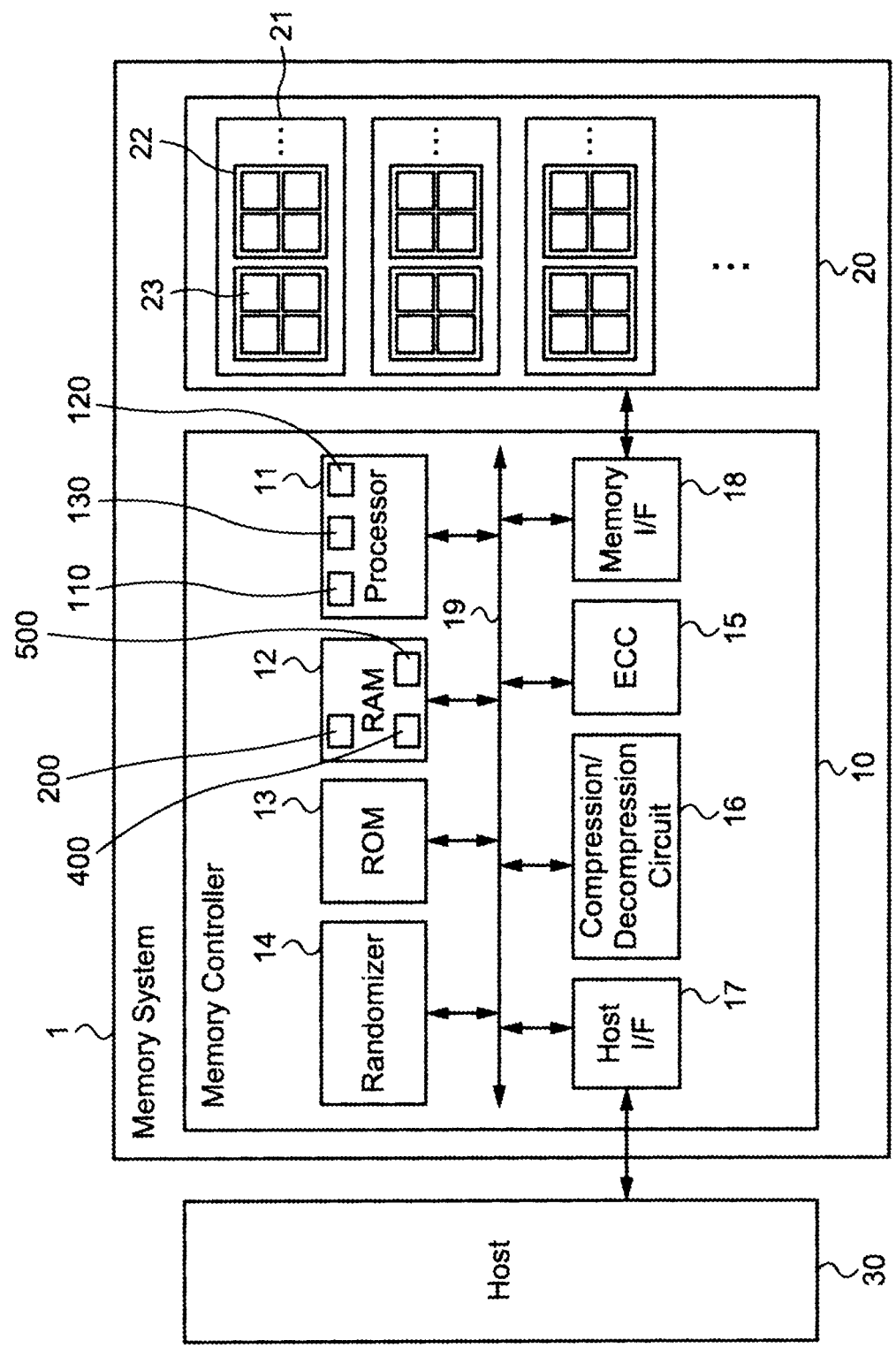
FIG. 16 is a block diagram of a memory system according to an embodiment.

FIG. 16 is a block diagram of the memory system 1 according to an embodiment. The configuration of FIG. 16 is similar to the configuration of FIG. 1 but differs from the configuration of FIG. 1 in that a processor 11 of FIG. 16 includes a historical value check routine unit 130. Since FIG. 16 is the same as FIG. 1 in the other configurations, detailed description thereof is omitted. The historical value check routine unit 130 performs processing such as integration, division, or exception rule of the history group 510 in the history group table 500 based on a result of a read inspection of the non-volatile memory 20 by the patrol management unit 120. Specifically, the historical value check routine unit 130 performs processing of integrating the history groups 510 into one history group 510 when historical values assigned to different history groups 510 are the same. Alternatively, when it is found that there is a memory group to which different historical values are to be assigned in one history group 510, the history group 510 is divided and a historical value suitable for each page is assigned, or an exception rule is set for the memory group.

5-2. Operation Flow of Integration Processing of Historical Values

Figure 17:
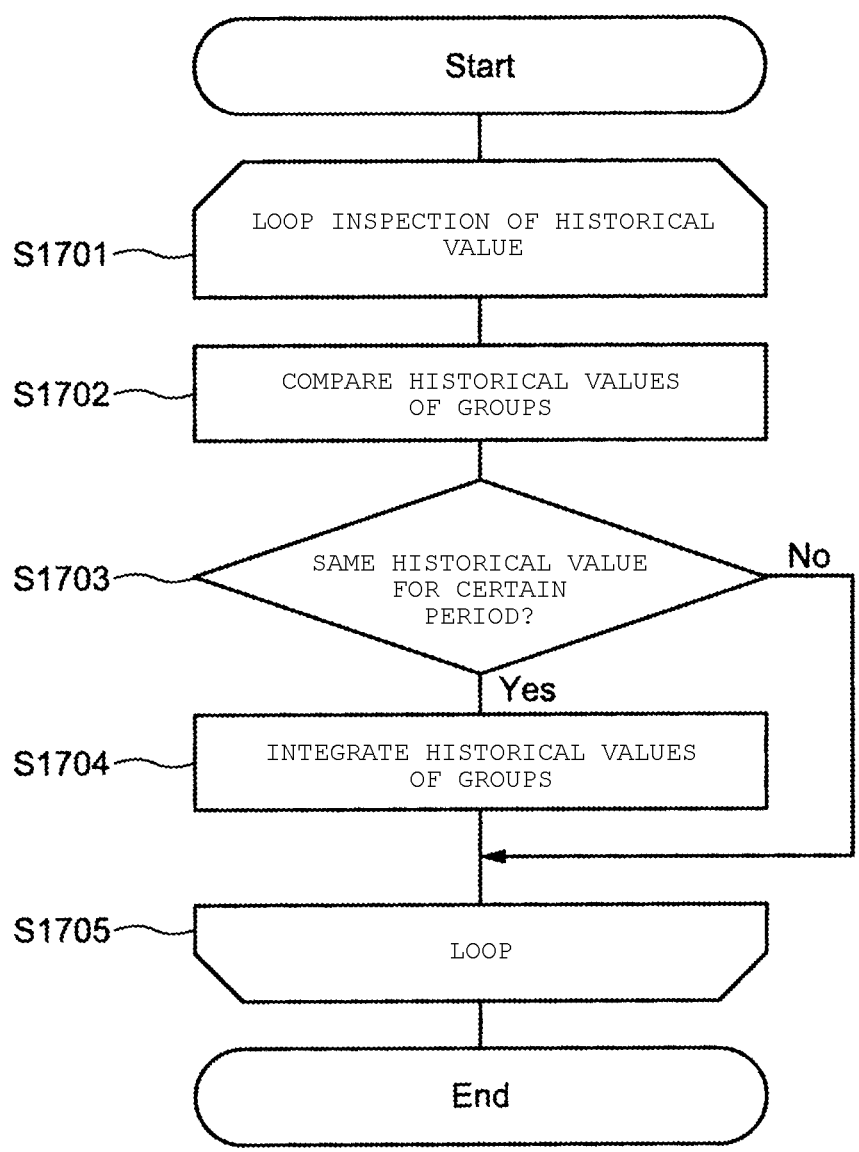
FIG. 17 is a flowchart of a loop inspection of historical values in a memory system according to an embodiment.

FIG. 17 is a flowchart of a loop inspection of historical values performed by the memory system 1 according to an embodiment. As illustrated in FIG. 17, the loop inspection of the historical values includes steps S1701 to S1705. The steps are performed by the processor 11 (particularly, the patrol management unit 120 and the historical value check routine unit 130 described above) of the memory controller 10. An operation illustrated in FIG. 17 is performed separately from the read operation based on a read request to the non-volatile memory 20 from the host 30. Further, the operation illustrated in FIG. 17 is periodically performed.

First, historical values of each history group 510 are inspected for the history group table 500 of an inspection target (step S1701). When the inspection of the historical values of all the history groups 510 is completed, or while the historical values of the history groups 510 are inspected, the historical values of the adjacent history groups 510 in each history group table 500 are compared with each other (step S1702). In S1702, the historical value of a group "#k" and the historical value of a group "#k+1" in the history group 510 of FIG. 5 are compared with each other. Here, k is an integer greater than or equal to 0. Specifically, the historical value of "#0" and the historical value of "#1" in the history group 510 of FIG. 5 are compared with each other, and the historical value of "#1" and the historical value of "#2" are compared with each other.

In S1702, when the historical value of the group "#k" and the historical value of the group "#k+1" are the same for a certain period ("Yes" in S1703), the historical value of the group "#k" and the historical value of the group "#k+1" are integrated (step S1704), and the processing proceeds to loop processing of step S1705. Meanwhile, in S1702, when the historical value of the group "#k" and the historical value of the group "#k+1" are different from each other, or when a period in which the historical value of the group "#k" and the historical value of the group "#k+1" are the same does not reach a predetermined period ("No" in S1703), the processing proceeds to the loop processing of step S1705. The processing is returned to step S1701 by the loop processing of S1705, and the steps S1701 to S1705 are repeatedly performed.

5-3. Integration Processing of Historical Values

FIG. 18 is a diagram illustrating update of the history group table 500 in the memory system 1 according to an embodiment. FIG. 18 illustrates detailed processing of step S1704 in FIG. 17. In FIG. 18, a history group table 500-1 is a table at a certain time point (hereinafter referred to as the first time point), a history group table 500-2 is a table at a second time point after predetermined time elapses from the first time point, and a history group table 500-3 is a table after the history groups 510 are integrated.

As illustrated in FIG. 18, in the history group table 500-1 at the first time point, a historical value (Index) of "#0" of the history group 510 (Group) is "#4", and the index of the group "#1" is "#3". In the history group table 500-2 which is a result of inspection at a second time point when a predetermined time elapsed from the first time point, an index of the group "#1" is changed from "#3" to "#4", and indices of the group "#0" and the group "#1" are both "#4". As such, when the historical values (Indices) of the group "#0" and the group "#1" are continuously the same for a certain period, the group "#0" and the group "#1" are integrated into the group "#0/#1". In other words, when the first historical value (Index #4) of the first group "#k (#0)" and the second historical value (Index #4) of the second group "#k+1 (#1)" have the same historical value, a common historical value (Index #4) common to the first group "#k" and the second group "#k+1" is managed in in association with the first group "#0" and the second group "#1" (Group "#0/#1").

5-4. Operation Flow of Division Processing of Historical Value

In the example of Section 5-2, "Operation Flow of Historical Value Integration Processing", when historical values of adjacent history groups 510 are the same for a certain period according to a loop inspection of the historical values, the history groups 510 are integrated. When there are subgroups having different historical values in the same history group 510 according to the loop inspection of the historical values, each of the subgroups can be divided.

Figure 19:
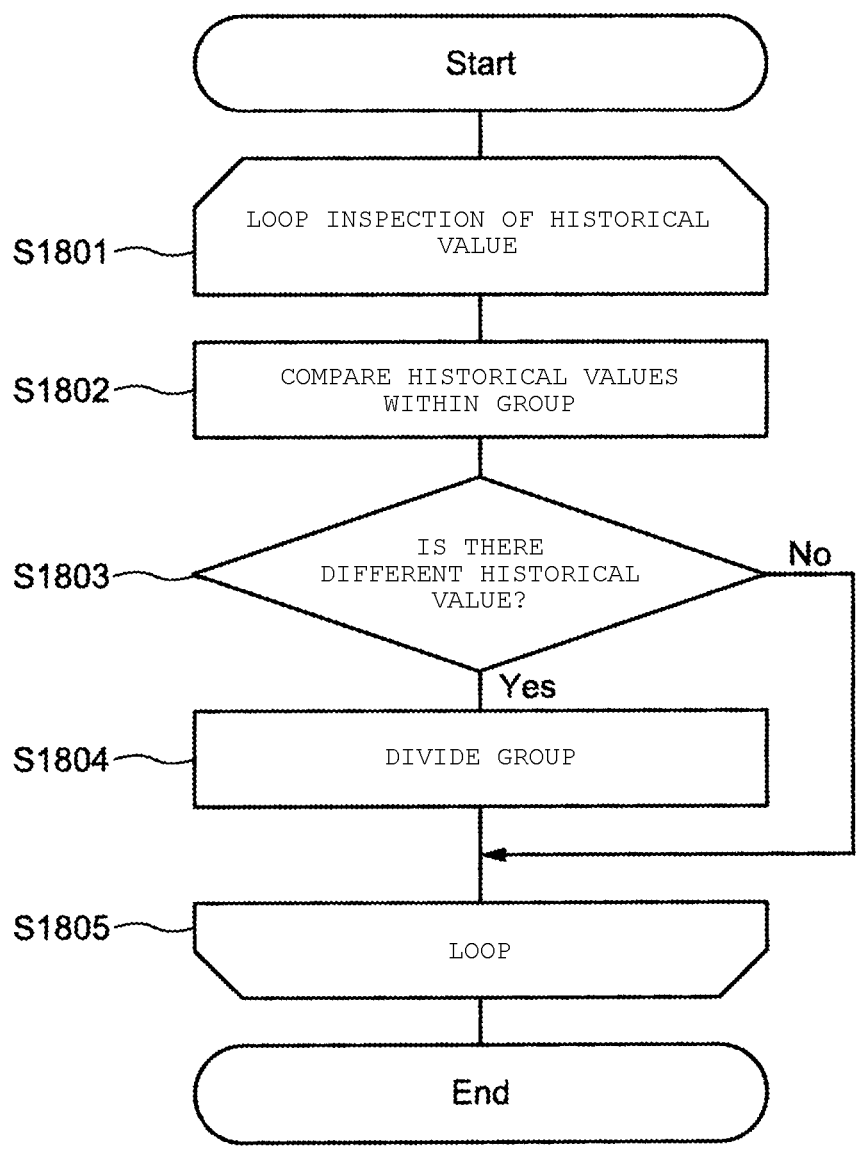
FIG. 19 is a flowchart of a loop inspection of historical values in a memory system according to an embodiment.

FIG. 19 is a flowchart of a loop inspection of historical values in the memory system 1 according to an embodiment. As illustrated in FIG. 19, the loop inspection of the historical values includes steps S1801 to S1805. The steps are performed by the processor 11 (particularly, the patrol management unit 120 and the historical value check routine unit 130 described above) of the memory controller 10. An operation illustrated in FIG. 19 is performed separately from a read operation based on a read request to the non-volatile memory 20 from the host 30.

First, the historical values of each history group 510 are inspected for the history group table 500 of an inspection target (step S1801). When the inspection for the historical values of all the history groups 510 is completed, or while the historical values of the history group 510 are inspected, the historical values in each history group table 500 are compared with each other for a plurality of memory groups in the same history group 510 (step S1802). Specifically, the historical values are compared with each other for respective word lines WL in the history group 510.

In S1802, when the historical values for the plurality of word lines WL in the group "#k" are different from each other ("Yes" in S1803), the group "#k" is divided into a group "#k$_1$" and a group "#k$_2$" according to the historical values of the word lines WL in the group "#k" (step S1804). That is, the group "#k" has a common historical value common to a plurality of word lines WL. The historical values of the word lines WL in the group "#k$_1$" are all the same, and the historical values of the word lines WL in the group "#k$_2$" are all the same. When division processing is performed in S1804, the processing proceeds to the loop processing of step S1805. Meanwhile, when the historical values of all the word lines WL in the group "#k" are the same ("No" in S1803), the processing proceeds to the loop processing in step S1805. The processing is returned to step S1801 by the loop processing of S1805, and steps of S1801 to S1805 are repeatedly performed.

5-5. Division Processing of Historical Value

FIG. 20 is a diagram illustrating update of a history group table 500 in the memory system 1 according to an embodiment. FIG. 20 illustrates detailed processing of step S1804 in FIG. 19. In FIG. 20, a history group table 500-4 and a write time table 400-4 are tables at a certain time point (hereinafter referred to as the third time point), and a history group table 500-5 is a table after the history group 510 is divided. The above-described division processing is processing after Section 5-3, "Integration Processing of Historical Values," and may be process of dividing the history group 510 integrated by the above-described integration processing and may be processing independent of the integration processing.

In the example illustrated in FIG. 20, historical values (Indices) of the word lines WL0 to WL2 are "#4" at a time point before the third time point, and the word lines WL belong to the group "#0". However, at the third time point, the indices for the word lines WL0 to WL1 are "#4", and the index for the word line WL2 is "#3". In such a case, as illustrated in the write time table 400-4 of FIG. 20, a group belonging to the word line WL2 is changed to "#1". As a result, the appearance is not different between the history group tables 500-4 and 5005, but the word line WL2 is no longer included in the group "#0" of the history group table 500-5 of Blk "#0", and the word line WL2 is included in the group "#1" of the history group table 500-5.

5-6. Exception Rule Processing of Historical Value

In the examples of Section 5-4, "Operation Flow of Division Processing of Historical Value" and Section 5-5, "Division Processing of Historical Value," when there are word lines WL corresponding to different historical values in the same history group 510, the word lines WL are divided by loop inspection of the historical values. Alternatively, the word lines WL to which different historical values are assigned in the same history group 510 may be excluded using an exception rule table 520.

Figure 21:
FIG. 21 is a diagram for illustrating updates of a history table in a memory system according to an embodiment.

FIG. 21 is a diagram illustrating update of a history group table 500 in the memory system 1 according to an embodiment. In FIG. 21, at a time point before the third time point, the index of the word lines WL0 to WL2 is "#4" and the word lines WL belong to the group "#0" as in the case of FIG. 20, and at the third time point, a historical value for the word lines WL0 to WL1 is "#4" and a historical value for the word line WL2 is "#3". In such a case, as illustrated in the exception rule table 520 of FIG. 21, the index of the word line WL2 is defined as "#3" in the group "#0" of the history group table 500-4 of Blk "#0".

As described above, according to the memory system 1 of the present embodiment, various tables are updated by background processing, and thus, the memory sizes of the tables can be reduced, and furthermore, an optimum read condition (setting) can be provided at a time when there is a read request from the host 30.

Sixth Embodiment

Application examples of the memory system 1 according to the first to fifth embodiments described above will be described with reference to FIGS. 22 and 23. In a sixth embodiment, a Zoned NameSpace (ZNS) SSD will be described. The ZNS is a method by which an address space is divided into zones and the host 30 performs a write request by designating the zone. The ZNS is standardized as part of NVM express (NVMe). By using the ZNS, the host 30 can efficiently manage a write operation and the like, and the size of the memory used in the memory controller 10 can be reduced.

Figure 22:
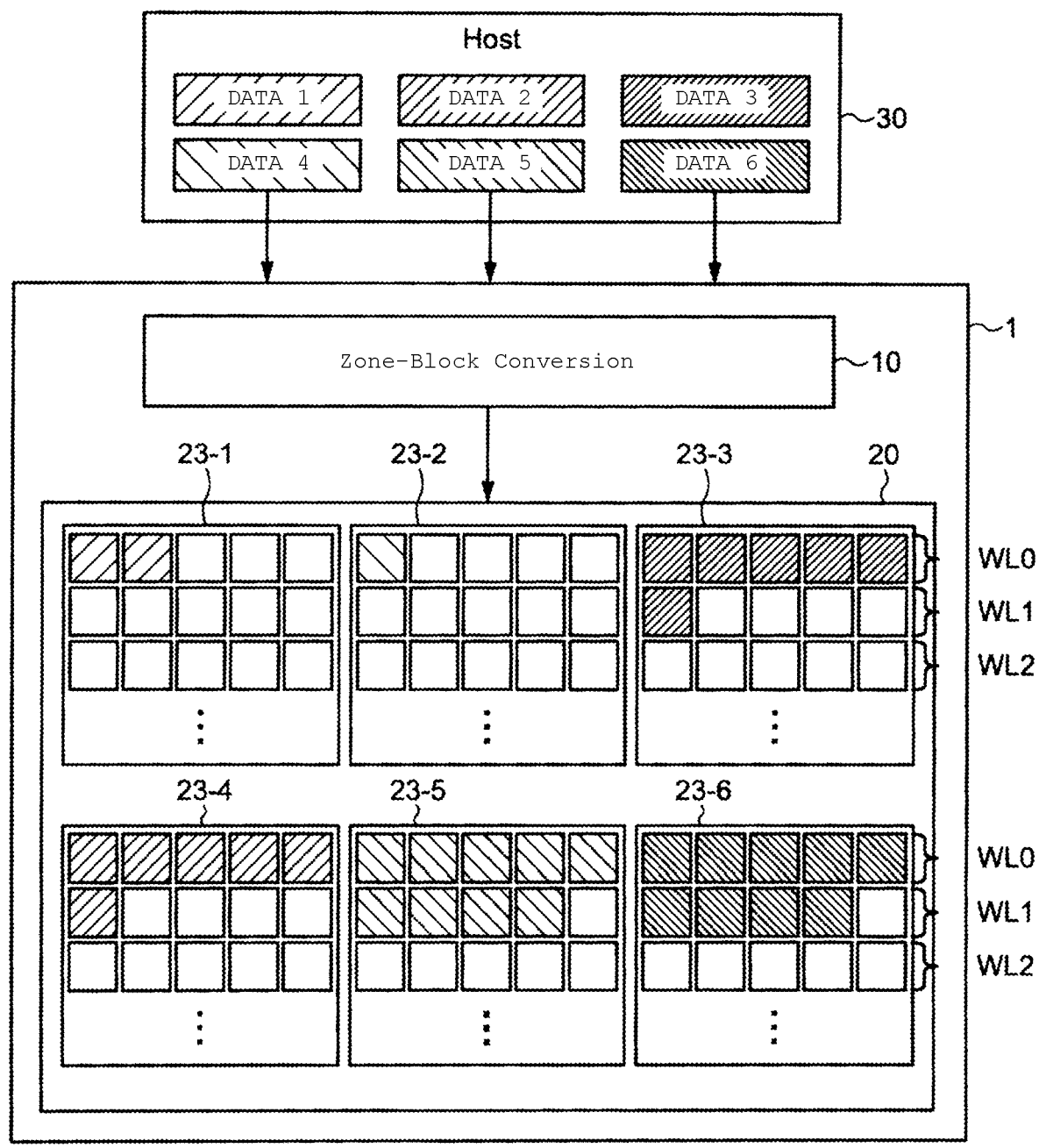
FIG. 22 is a diagram of an application example of a memory system according to an embodiment.

FIG. 22 illustrates a case in which there is a write request of data 1 to 6 from the host 30. The data 1 to 6 are written to different zones. Here, for example, the data 1 to 6 are data related to different applications. When the memory system 1 receives a write request for the data 1 to 6 from the host 30, the memory controller 10 converts an address of the zone to which the data 1 to 6 are written into an address of a block in the non-volatile memory 20. Then, each of the data 1 to 6 is written to the converted block.

As illustrated in FIG. 22, a write operation is performed for each of the data 1 to 6 sequentially from the first word line WL of the block corresponding to the zone designated by the host 30. In FIG. 22, the data 1 to 6 are written to the memory blocks 23-1 to 23-6, respectively. The amount of data 1 and 2 is smaller than the amount of the other data 3 to 6.

Figure 23:
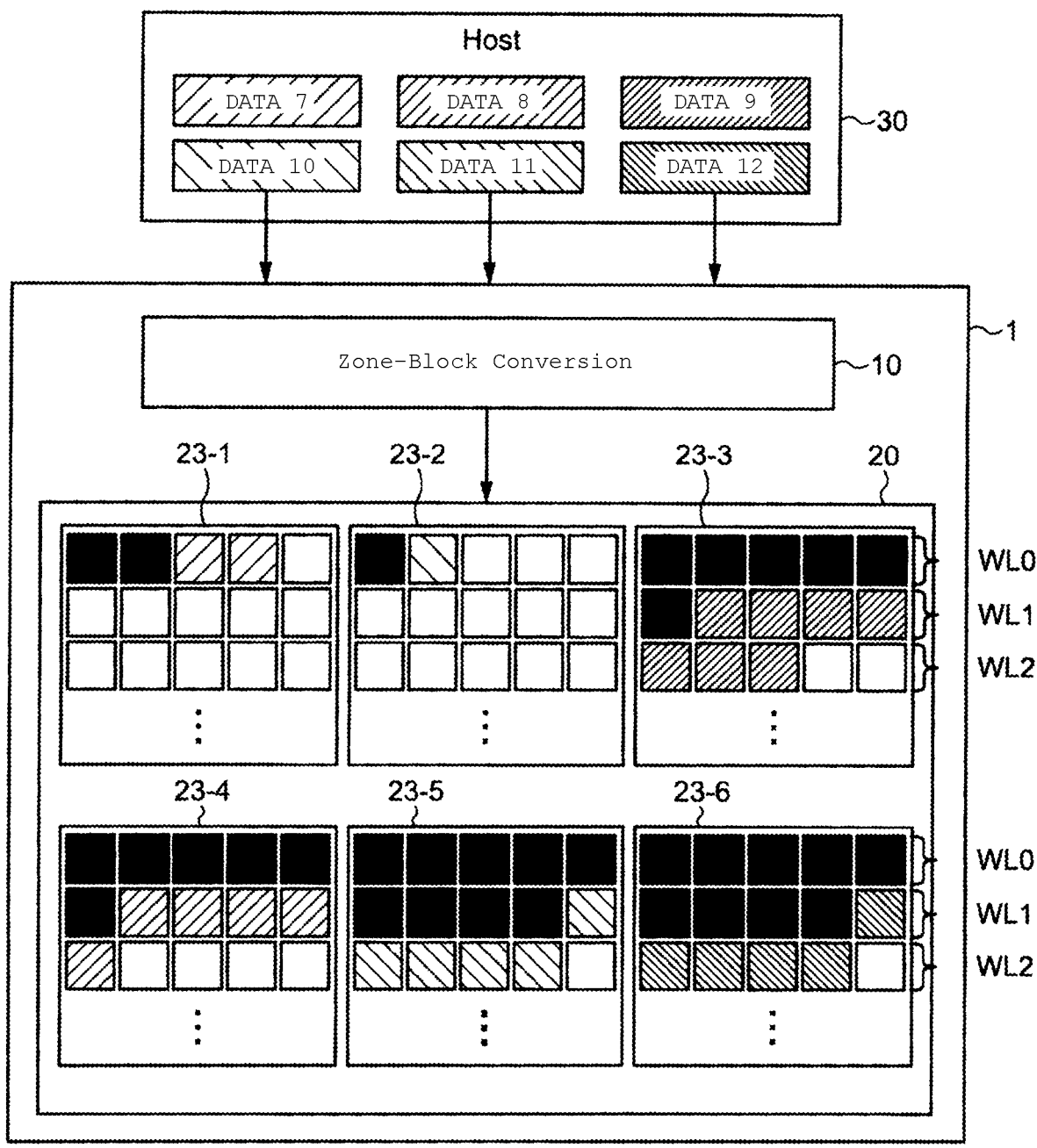
FIG. 23 is a diagram of an application example of a memory system according to an embodiment.

FIG. 23 illustrates a case in which there is a write request of data 7 to 12 from the host 30 after a certain time elapses from completion of the write operation of the data 1 to 6. The data 7 to 12 are data related to the same applications as the data 1 to 6, respectively. That is, the host 30 performs a write request to, for example, the data 7 by designating the same zone as the data 1. As described above, the data 7 to 12 are written to the memory blocks 23-1 to 23-6, respectively. The amount of the data 7 to 8 is smaller than the amount of the other data 9 to 12. As a result, the memory blocks 23-1 to 23-2 have greater difference in time when the write operation of the data stored in the memory block is completed than in the memory blocks 23-3 to 23-6.

As described above, the ZNS SSD may have the amount of data to be written and the frequency of update of data different for each application. For example, data for which a write operation is performed in the same block for significantly different time may coexist in an application having a small amount of data and a low frequency of update. Even in such a case, a read condition can be set according to the time when a write operation is performed by applying the memory system 1 according to the first to fifth embodiments, and thus, the number of retries and refreshes during a read operation can be reduced, and an operation of the memory system 1 can be speeded up.

The processing illustrated in FIG. 14 may be performed by using the background processing according to the fifth embodiment described above.

The block (Blk) described above indicates a physical block. Alternatively, the block (Blk) may be a logical block. The logical block is, for example, a set of a plurality of physical blocks, and the memory controller 10 can write, read, or erase the plurality of physical blocks configuring the logical block in parallel.

The present disclosure is not limited to the above-described embodiments and such example embodiments may be modified without departing from the scope of the present disclosure. For example, additions, removals, or design changes of elements of a compression/decompression circuit of the present disclosure, which are suggested to those of ordinary skill in the art, are also included in the scope of the present disclosure. Furthermore, each of the example embodiments can be appropriately combined with one or more of the other examples, and technical matters common to each described embodiment are to be considered included in each embodiment even when there is no explicit description of such overlapping technical matters for a particular example embodiment.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
a non-volatile memory in which data can be stored in a plurality of pages including a first page and a second page; and
a memory controller configured to:
perform a first write operation on the first page at a first time and assign the first page to a first group,
perform a second write operation on the second page at a second time after the first time and assign the second page to a second group different from the first group,
in response to a first read request from a host, perform a first read operation on the first page at a time after the first time using a first parameter and store a first index value in association with the first group and the first parameter,
in response to a second read request from the host, determine a second parameter for a second read operation to be performed on the second page using a time difference between the first time and the second time and the first index value stored in association with the first page, and then perform the second read operation on the second page using the second parameter and store a second index value in association with the second group and the second parameter, and
after the second read operation, update assignment of the first and second pages to a same group, such that the first and second pages are associated with a common index value and a common parameter.

2. The memory system according to claim 1, wherein each of the first and second parameters indicates a shift value added to a predetermined read voltage applied to a word line to which one of the first and second pages associated with the parameter belongs.

3. The memory system according to claim 1, wherein the memory controller is further configured to:
store the first time during the first write operation, store the second time during the second write operation, and calculate the time difference based on the stored first time and the stored second time when determining the second parameter of the second read operation.

4. The memory system according to claim 1, wherein the memory controller is further configured to store the first time during the first write operation, and calculate the time difference between the first time and the second time during the second write operation.

5. The memory system according to claim 1, wherein the plurality of pages further includes a third page, and the memory controller is further configured to:
perform a third write operation on the third page at a third time after the second time, and
perform a third read operation on the third page using the second index value.

6. The memory system according to claim 1, wherein the controller is further configured to perform a read inspection for the non-volatile memory separately from the first and second read requests to determine whether data can be correctly read from the first and second pages using the first and second parameters, respectively.

7. The memory system according to claim 1, wherein the controller is further configured to perform, separately from the first and second read requests from the host, a read inspection for the non-volatile memory, and determine a plurality of parameters related to read voltages for reading data from each of the plurality of pages.

8. The memory system according to claim 6, wherein the read inspection is performed periodically.

9. The memory system according to claim 7, wherein the plurality of pages further includes a fourth page, and the memory controller is further configured to:
perform a fourth write operation on the fourth page at a fourth time after the second time,
when a time difference between the first time and the fourth time is within a predetermined difference, perform a fourth read operation using the first index value, and
when a time difference between the second time and the fourth time is within the predetermined difference, perform the fourth read operation using the second index value.

10. The memory system according to claim 1, wherein the memory controller is further configured to compress a table in which X read conditions for X memory groups including a first memory group including the first page and a second memory group including the second page are defined, based on whether there are memory groups having the same read condition among the X memory groups, where X is an integer greater than or equal to 2.

11. The memory system according to claim 1, wherein the memory controller is further configured to:
perform a third read operation for the first and second pages after the first and second read operations, and
update the assignment of the first and second pages to the same group based on a result of the third read inspection operation.

12. A memory controller, comprising:
a memory interface connectable to a non-volatile memory in which data can be stored in a plurality of pages including a first page and a second page; and
a processor configured to:
perform a first write operation on the first page at a first time and assign the first page to a first group,
perform a second write operation on the second page at a second time after the first time and assign the second page to a second group different from the first group,
in response to a first read request from a host, perform a first read operation on the first page at a time after the first time using a first parameter and store a first index value in association with the first group and the first parameter,
in response to a second read request from the host, determine a second parameter for a second read operation using a time difference between the first time and the second time and the first index value stored in association with the first page, and then perform the second read operation on the second page using the second parameter and store a second index value in association with the second group and the second parameter, and
after the second read operation, update assignment of the first and second pages to a same group, such that the first and second pages are associated with a common index value and a common parameter.

13. The memory system according to claim 11, wherein the memory controller performs the third read operation in response to a third read request from the host.

14. The memory system according to claim 11, wherein the memory controller performs the third read operation for inspection of the first and second parameters, separately from read requests from the host.

* * * * *